(12) United States Patent
Wang et al.

(10) Patent No.: US 9,751,130 B2
(45) Date of Patent: *Sep. 5, 2017

(54) METHODS FOR THE PRODUCTION OF SILVER NANOWIRES

(71) Applicant: BASF SE, Ludwigshafen (DE)

(72) Inventors: Yuliang Wang, Plainsboro, NJ (US); Janet Cravens Dickerson, San Diego, CA (US)

(73) Assignee: BASF SE, Ludwigshafen (DE)

( * ) Notice: Subject to any disclaimer, the term of this patent is extended or adjusted under 35 U.S.C. 154(b) by 235 days.

This patent is subject to a terminal disclaimer.

(21) Appl. No.: 14/341,784

(22) Filed: Jul. 26, 2014

(65) Prior Publication Data

US 2015/0283615 A1     Oct. 8, 2015

Related U.S. Application Data

(63) Continuation of application No. 13/053,176, filed on Mar. 21, 2011, now Pat. No. 8,814,979, which is a (Continued)

(51) Int. Cl.
| | |
|---|---|
| *B22F 9/24* | (2006.01) |
| *C22C 5/06* | (2006.01) |
| *C30B 7/14* | (2006.01) |
| *C30B 29/02* | (2006.01) |
| *C30B 29/60* | (2006.01) |

(Continued)

(52) U.S. Cl.
CPC .............. *B22F 9/24* (2013.01); *B22F 1/004* (2013.01); *B22F 1/0044* (2013.01); *C22B 11/04* (2013.01); *C22C 5/06* (2013.01); *C30B 7/14* (2013.01); *C30B 29/02* (2013.01); *C30B 29/605* (2013.01); *B22F 2301/255* (2013.01); *B22F 2998/00* (2013.01); *Y10S 977/896* (2013.01)

(58) Field of Classification Search
None
See application file for complete search history.

(56) References Cited

U.S. PATENT DOCUMENTS

| | | |
|---|---|---|
| 4,539,041 A | 9/1985 | Figlarz et al. |
| 5,922,409 A | 7/1999 | McMordie et al. |
| | (Continued) | |

FOREIGN PATENT DOCUMENTS

CN     2007-10046510.2     7/2008

OTHER PUBLICATIONS

U.S. Appl. No. 60/815,627 Entitled: "Methods of Controlling Nanostructure Formations and Shapes", filed Jun. 21, 2006.
(Continued)

*Primary Examiner* — George Wyszomierski
(74) *Attorney, Agent, or Firm* — Oblon, McClelland, Maier & Neustadt, L.L.P.

(57) ABSTRACT

Embodiments of the present invention are directed to novel methods for the solution-based production of silver nanowires by adaptation of the polyol process. Some embodiments of the present invention can be practiced at lower temperature and/or at higher concentration than previously described methods. In some embodiments reactants are added in solid form rather than in solution. In some embodiments, an acid compound is added to the reaction.

20 Claims, 10 Drawing Sheets

Related U.S. Application Data continuation of application No. 12/362,960, filed on Jan. 30, 2009, now Pat. No. 7,922,787.

(60) Provisional application No. 61/025,775, filed on Feb. 2, 2008.

(51) Int. Cl.
  *B22F 1/00* (2006.01)
  *C22B 3/00* (2006.01)

(56) References Cited

U.S. PATENT DOCUMENTS

| | | | |
|---|---|---|---|
| 7,922,787 B2* | 4/2011 | Wang | B22F 9/24 |
| | | | 75/371 |
| 8,814,979 B2* | 8/2014 | Wang | B22F 9/24 |
| | | | 75/371 |
| 2005/0056118 A1 | 3/2005 | Xia et al. | |
| 2005/0090081 A1 | 4/2005 | Mascolo et al. | |
| 2006/0115536 A1 | 6/2006 | Yacaman et al. | |
| 2006/0235087 A1 | 10/2006 | Alexandridis et al. | |
| 2007/0034052 A1 | 2/2007 | Vanheusden et al. | |
| 2007/0074316 A1 | 3/2007 | Alden et al. | |
| 2007/0158611 A1 | 7/2007 | Oldenburg | |
| 2008/0003130 A1 | 1/2008 | Xia et al. | |
| 2008/0210052 A1 | 9/2008 | Allemand | |
| 2008/0245186 A1* | 10/2008 | Yang | B22F 9/24 |
| | | | 75/362 |
| 2009/0130433 A1 | 5/2009 | Takada | |
| 2011/0023658 A1 | 2/2011 | Wang et al. | |

OTHER PUBLICATIONS

Fievet et al., "Homogeneous and Heterogeneous Nucleations in the Polyol Process for the Preparation of Micron and Submicron Size Metal Particles", *Solid State Ionics*, 32/33: 198-205 (1989).

Ducamp-Sanguesa et al., "Synthesis and Characterization of Fine Monodisperse Silver Particles of Uniform Shape", *Journal of Solid State Chemistry*, 100: 272-280 (1992).

Silvert et al., "Preparation of Colloidal Silver Dispersions by the Polyol Process: Part 1—Synthesis and Characterization", *J. Mater. Chem.*, 6(4): 573-577 (1996).

Silvert et al., "Preparation of Colloidal Silver Dispersons by the Polyol Process: Part 2—Mechanism of Particle Formation", *J. Mater. Chem.*, 7(2): 293-299 (1997).

Carotenuto et al., "Preparation and Characterization of Nano-sized Ag/PVP Composites For Optical Applications", *Eur. Phys. J.*, 16: 11-17 (2000).

Sun et al., "Crystalline Silver Nanowires by Soft Solution Processing", *Nano Letters*, 2(2): 165-168 (2002).

Sun et al., "Large-Scale Synthesis of Uniform Silver Nanowires Through a Soft, Self-Seeding, Polyol Process", *Adv. Mater.*, 14(11): 833-837 (2002).

Sun et al., "Uniform Silver Nanowires Synthesis by Reducing $AgNO_3$ with Ethylene Glycol in the Presence of Seeds and Poly(Vinyl Pyrrolidone", *Chem. Mater.*, 14: 4736-4745 (2002).

Sun et al., Shape-Controlled Synthsis of Gold and Silver Nanoparticles, *Science*, 298: 2176-2179 (2002).

Sun et al., "Polyol Synthesis of Uniform Silver Nanowires: A Plausible Growth Mechanism and the Supporting Evidence", *Nano Letters*, 3(7): 955-960 (2003).

Wiley et al., "Polyol Synthesis of Silver Nanoparticles: Use of Chloride and Oxygen to Promote Formation of Single-Crystal, Truncated Cubes and Tetrahedrons", *Nano Letters*, 4(9): 1733-1739 (2004).

Wiley et al., "Polyol Synthesis of Silver Nanostructures: Control of Product Morphology with Fe(II) or Fe (III) Species", *Langmuir*, 21(18): 8077-8080 (2005).

Wiley et al., "Shape-Controlled Synthesis of Metal Nanostructures: The Case of Silver", *Chem. Eur. J.*, 11: 454-463 (2005).

Wiley et al., "Maneuvering the Surface Plasmon Resonance of Silver Nanostructures Through Shape-Controlled Synthesis", *J. Phys. Chem. B*, 110: 15666-15675 (2006).

Reyes-Gasga et al., "On the Structure of Nanorods and Nanowires with Pentagonal Cross-sections", *Journal of Crystal Growth*, 286: 162-172 (2006).

Wiley et al., "Syntheis of Silver Nanostructures with Controlled Shape Properties", *Acc. Chem. Res.*, 40: 1067-1076 (2007).

Chen et al., "One-Dimensional Nanostructures of Metals: Large-Scale Synthesis and Some Potential Applications", *Langmuir*, 23: 4120-4129 (2007).

Im et al., "Large-Scale Synthesis of Silver Nanocubes: The Role of HCl in Promoting Cube Perfection and Monodispersity", *Angew. Chem. Int. Ed.*, 44: 2154-2157 (2005).

Lofton et al., "Mechanisms Controlling Crystal Habits of Gold and Silver Colloids", *Adv. Funct. Mater.*, 15: 1197-1208 (2005).

Zhang et al., "High-Concentration Preparation of Silver Nanowires: Restraining in Situ Nitric Acidic Etching by Steel-Assisted Polyol Method", *Chem. Mater.*, 20: 1699-1704 (2008).

Delphion Summary of Chinese patent application CN—2007/010046510.2 including English title and abstract—2 pages. Published Jul. 16, 2008.

Korte et al., Rapid Synthesis of silver nanowires through a CuCl- or $CuCl_2$-mediated polyol process, Journal of Materials Chemisty, 2008, vol. 18, p. 437-441.

International Search Report (ISR) and Written Opinion of the International Search Authority (WOISA) for copending application PCT/US2009/032785 dated Nov. 13, 2009; 8 pages.

Submission under Rule 66.3 of the PCT with Article 34 amendments and Arguments presented in a Chapter II Demand and made in response to the ISR & WOISA; 17 pages, dated Dec. 18, 2009.

English Translation of Chinese Patent Application Disclosure No. CN 101220506A, published Jul. 16, 2008—Reference B1—Originally filed on Feb. 25, 2009 in Chinese.

E. Majidi and B.D. Gatesm, Optimizing Growth Rates and Thermal Stability of Silver Nanowires, Mater. Res. Soc. Symp. Proc. vol. 1017, (2007), ID: 1017-DD18-12, 6 pages total.

Gou, L. et al., "Convenient Rapid Synthesis of Ag Nanowires", Chem, Mater. 19(7): 1755-1760 (published on web on Mar. 13, 2007).

\* cited by examiner

METHODS FOR THE PRODUCTION OF SILVER NANOWIRES

CROSS REFERENT TO RELATED APPLICATIONS

This application is a continuation of U.S. Non-provisional patent application Ser. No. 13/053,176 filed on Mar. 21, 2011, now U.S. Pat. No. 8,814,979 which application is a continuation of U.S. Non-provisional patent application Ser. No. 12/362,960, filed Jan. 30, 2009, now U.S. Pat. No. 7,922,787. This application also claims the benefit of U.S. Provisional Patent Application Ser. No. 61/025,775, filed on Feb. 2, 2008; all of which are herein incorporated by reference for any and all purposes.

STATEMENT REGARDING FEDERALLY SPONSORED RESEARCH OR DEVELOPMENT

This invention was made, in part, with government support under grant numbers STTR Phase 2 W911SR-04-C-0079 and STTR Phase 2 W911SR-040C-0086 from the Department of Defense. The United States government may have certain rights to this invention.

The section headings used herein are for organizational purposes only and should not be construed as limiting the subject matter described in any way.

BRIEF DESCRIPTION OF DRAWINGS

The skilled artisan will understand that the drawings, described below, are for illustration purposes only. The drawings are not intended to limit the scope of the present teaching in any way.

In the drawings, the sizes and relative positions of elements in the drawings are not necessarily drawn to scale. For example, the shapes of various elements and angles may not be drawn to scale, and some of these elements may be arbitrarily enlarged and positioned to improve drawing legibility. Further, the particular shapes of the elements as drawn may not be intended to convey any information regarding the actual shape of the particular elements, and may have been selected solely for ease of recognition in the drawings.

Figure 1A:
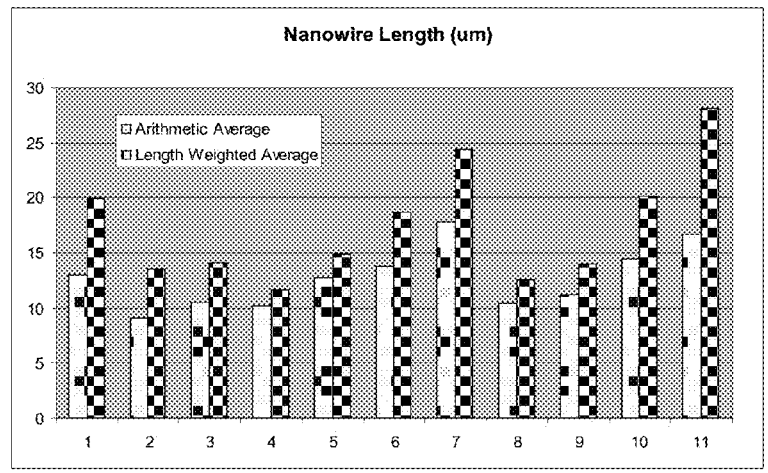
FIG. 1A is a bar graph depicting average nanowire length of 11 different samples wherein the average nanowire length of each sample is determined by either arithmetic or length weighted calculations.

All literature and similar materials cited in this application, including but not limited to patents, patent applications, articles, books and treatises, regardless of the format of such literature or similar material, are expressly incorporated by reference herein in their entirety for any and all purposes.

DESCRIPTION

1. Field

The present invention pertains to the field of nanotechnology and to the polyol mediated production of silver nanostructures such as silver nanowires.

2. Introduction

Production of silver nanostructures by the so called "polyol process" or "polyol method" is known (See for Example: Wiley et al., *Shape-Controlled Synthesis of Metal Nanostructures: The case of Silver*, Chem. Eur. J., 11: 454-463 (2005) and Wiley et al., *Polyol Synthesis of Silver Nanoparticles: Use of Chloride and Oxygen to Promote the Formation of Single-Crystal, Truncated Cubes and Tetrahedrons*, Nano Letters, 4(9): 1733-1739 (2004)). In general, the polyol process is a solution-based method. According to early literature accounts, a silver ion containing solution is created by mixing a silver compound in a polyol solvent. The silver compound can be an inorganic salt such as silver nitrate ($AgNO_3$) or an organic salt such as silver acetate. The silver compound is reduced to silver metal by practice of the polyol process. It is this silver metal that forms the silver nanostructures (See: Ducamp-Sanguesa et al., *Synthesis and Characterization of Fine and Monodisperse Silver Particles of Uniform Shape*, Journal of Solid State Chemistry, 100: 272-280 (1992)). In a typical polyol synthesis, silver atoms (which produce the metal that forms the nanostructures) may be obtained by reducing $AgNO_3$ with ethylene glycol (EG) through the following reactions:

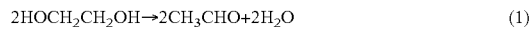

$$2HOCH_2CH_2OH \rightarrow 2CH_3CHO + 2H_2O \quad (1)$$

$$2Ag^+ + 2CH_3CHO \rightarrow CH_3CHO-OHCCH_3 + 2Ag + 2H^+ \quad (2)$$

In general, the polyol serves as a solvent for the silver compound as well as a solvent for the reaction. According to the early literature, the polyol is also the reducing agent that reduces the silver compound to silver metal. Silver production is controlled by the rate of Ag(I) reduction, which increases with temperature (Ducamp-Sanguesa et al., *Journal of Solid State Chemistry*, 100: 272-280 (1992) at page 274, col. 2). Thus, the polyol process is typically practiced at elevated temperature although the reaction has been known to occur at ambient temperature in the presence of poly(vinyl pyrrolidone) (PVP) (See: Carotenuto et al., *Eur. Phys. J. B*, 16: 11-17 (2000) at page 12, col. 2 and US Published Patent Application No. US 2007/0034052 A1 to Vanheusden et al. published on Feb. 15, 2007 at paragraph 38).

In early experiments the polyol process was practiced by either combining (e.g. mixing) the silver compound with polyol and heating (See: Figlarz et al., U.S. Pat. No. 4,539, 041) or dissolving the silver compound in the polyol and mixing the solution with a portion of heated polyol (Ducamp-Sanguesa et al., *Journal of Solid State Chemistry*, 100: 272-280 (1992)). In either case, the combined reactants were heated until the metal formed (usually as a metallic precipitate or powder). The metal was then typically isolated by filtration or decantation.

One problem observed with early practice of the polyol process was that the metal particles sintered (would aggregate to larger metal particle). However, it was found that sintering in the polyol process could be minimized or prevented by use of an organic protective agent (Ducamp-Sanguesa et al., *Journal of Solid State Chemistry*, 100: 272-280 (1992) at page 275, col. 2). A commonly used organic protective agent is polyvinylpyrrolidone (PVP). Thus, the process has thereafter often been practiced by independently combining a solution of the silver compound (i.e. the 'silver solution') and a solution of the organic protective agent with a heated portion of the polyol. Often, each of the silver solution and solution comprising the organic protective agent are produced by dissolving the respective silver compound or organic protective agent in the polyol.

Some of the more recent literature reports have been directed to adaptations of the polyol process for the production of various selected nanostructures (See, for example: Sun et al., *Polyol Synthesis of Uniform Silver Nanowires: A Plausible Growth Mechanism and the Supporting Evidence, Nano Letters*, 3(7): 955-960 (2003); Wiley et al., *Polyol Synthesis of Silver Nanostructures: Control of Product Morphology with Fe(II) or Fe(III) Species, Langmuir*, 21(18): 8077-8080 (2005); Wiley et al., *Shape-Controlled Synthesis of Metal Nanostructures: The Case of Silver, Chem. Eur. J.*, 11: 454-463 (2005); and Wiley et al., *Synthesis of Silver Nanostructures with Controlled Shapes and Properties, Acc. Chem. Res.*, 40: 1067-1076 (2007)). However, processes disclosed for the selective production of silver nanowires generally require reaction temperatures of at least 148° C. and are practiced at relatively dilute reaction conditions.

The polyol process can be practiced with addition of a seeding material to promote silver nanowire formation in a so-called "seeding process". Alternatively, in a "seedless/self-seeding process" silver metal clusters produced during the reaction serve as the seed for silver nanowire formation. When a seeding process is used, the reactions have been characterized as either heterogeneous or homogeneous. In a homogeneous reaction, seeds are first formed using the metal from which the nanostructures are created. For example, if silver nanowires are the desired product, the seeds are silver. By comparison, in a heterogeneous reaction, seeds of a different metal are prepared and then the nanostructures of the desired metal are grown from these seeds. For example, if silver nanostructures are desired in a heterogeneous reaction, platinum seeds could be prepared from which the silver nanostructures are then grown.

Silver nanowires are electrically conductive (See: Sun et al., *Crystalline Silver Nanowires by Soft Solution Processing, Nano Letters*, 2(2): 165-168 (2002) at page 168, col. 1). Accordingly, it has been suggested that silver nanowires should find uses in a variety of areas such as catalysis, electronics, photonics and electrochemistry (See: Sun et al., *Large-Scale Synthesis of Uniform Silver Nanowires Through a Soft, Self-Seeding, Polyol Process, Adv. Mater.* 14(11): 833-837 (2002) at page 836, col. 2).

Because silver nanowires are commercially desirable, it would be useful to have improved methods for their commercial manufacture.

3. Definitions

For the purposes of interpreting this specification, the following definitions will apply and whenever appropriate, terms used in the singular will also include the plural and vice versa. In the event that any definition set forth below conflicts with the usage of that word in any other document, the definition set forth below shall always control for purposes of interpreting the scope and intent of this specification and its associated claims.

Notwithstanding the foregoing, the scope and meaning of any document incorporated herein by reference should not be altered by the definition presented below. Rather, said incorporated document should be interpreted as it would be by the ordinary practitioner based on its content and disclosure and then interpreted with respect to how it relates to the content of the description provided herein.

The use of "or" means "and/or" unless stated otherwise or where the use of "and/or" is clearly inappropriate. The use of "a" means "one or more" unless stated otherwise or where the use of "one or more" is clearly inappropriate. The use of "comprise", "comprises", "comprising", "include", "includes", and "including" are interchangeable and not intended to be limiting. Furthermore, where the description of one or more embodiments uses the term "comprising", those skilled in the art would understand that in some specific instances, the embodiment or embodiments can be alternatively described using language "consisting essentially of" and/or "consisting of".

As used herein, 'acid compound' refers to any compound having a $pK_a$ lower than 7. In some embodiments, the acid compound has a $pK_a$ less than 3.5. In some embodiments, the acid compound has a $pK_a$ less than 2. In some embodiments, the acid compound has a $pK_a$ less than 1. The acid compound can be any acid that does not appreciably interfere with the reduction of the silver compound to silver metal or otherwise interfere with the reaction. In some embodiments, the acid compound may also be selected to avoid halide ion or iron. In some embodiments, the acid compound is intended to refer to a mixture of two or more compounds have a $pK_a$ less than 7, less than 3.5, less than 2 or less than 1. For the avoidance of any doubt however, the 'acid compound' is not intended to refer to a 'silver compound' as discussed and defined below.

As used herein, 'aspect ratio' should be interpreted differently depending on whether it is being used with reference to an individual nanostructure or to the general characteristics of bulk material.

With respect to an individual nanostructure, 'aspect ratio', as used herein, refers to the length divided by diameter of the individual nanostructure. For example, a nanowire having a length of 30,000 nanometers (30 μm) and a diameter of 50 nanometers would have an aspect ratio of 600 (30,000/50=600).

Figure 2A:
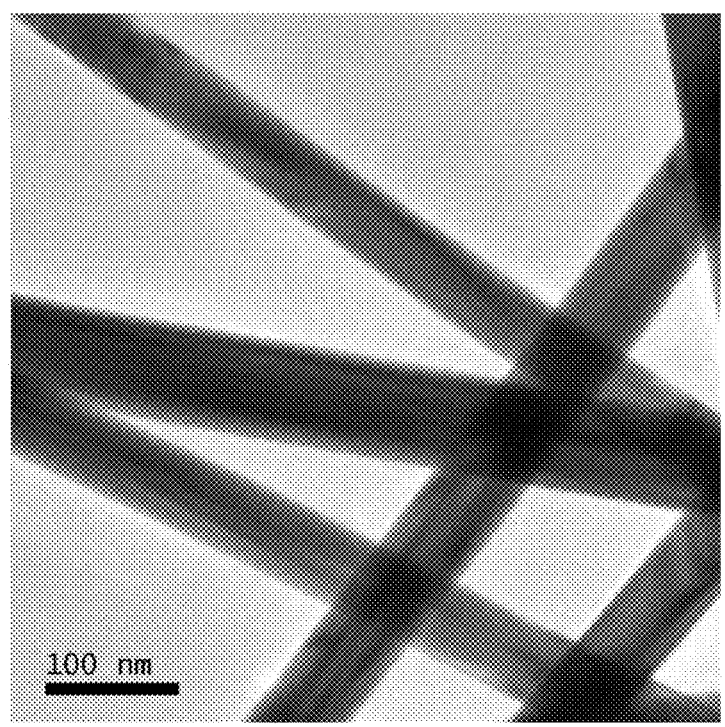
FIGS. 2A and 2B are transmission electron micrograph (TEM) images of representative preparations of silver nanowires.
Figure 2B:
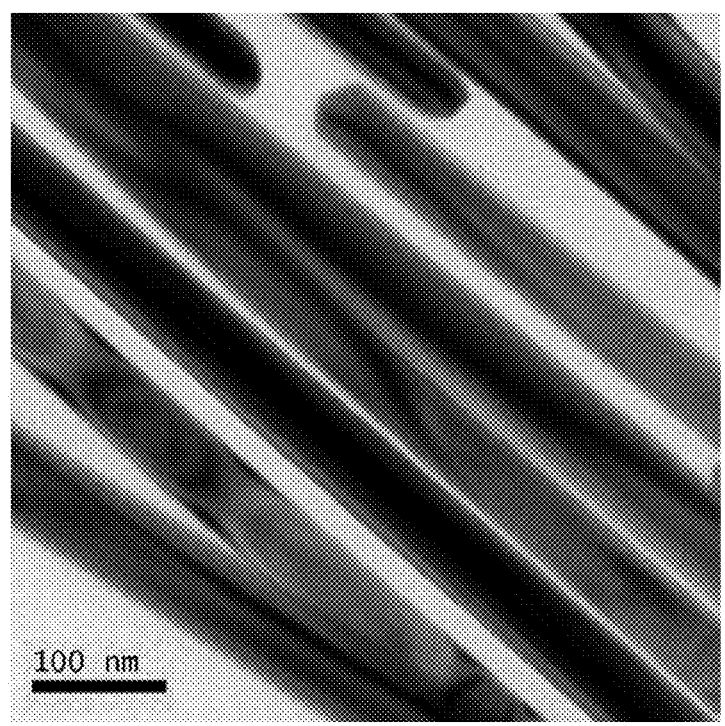
Figure 3:
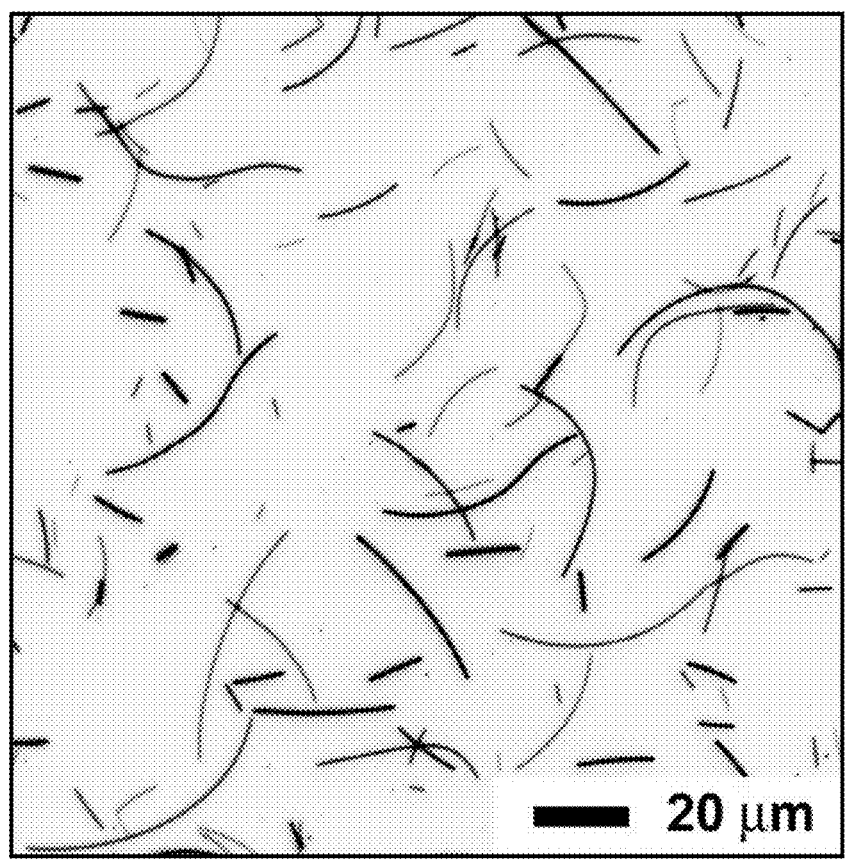
FIG. 3 is a microscope image of a representative nanowire preparation after final processing.

With respect to bulk material, 'aspect ratio' refers to the averaged aspect ratio that is characterized based on the average length and diameter dimensions obtained by sampling individual nanostructures contained in the bulk material. For example, the "aspect ratio" of bulk product silver nanowires can be determined as follows:

This method is based upon collecting measurement data from individual nanostructures in a population using both optical (FIG. 3) and electron microscopy (FIGS. 2A and 2B). The lengths are obtained using optical microscopy (although other methods such as electron microscopy could be used), and the diameters are determined using electron microscopy (although other methods could be used). The diameters and lengths are determined from a sampling taken from the bulk material which contains the produced nanostructures.

Using this process, approximately 500 nanostructures are measured to determine the lengths, and more than 50 nanostructures are measured to determine the diameters. An average length and average diameter is determined for the nanostructures examined. The results are then plotted (e.g. FIGS. 1A-1E). It is also to be understood that the selection of 500 and 50 nanostructures, respectively, referred to above is arbitrary and not intended to be a limitation. Rather, the number of nanostructures selected for analysis can depend on the characteristics (e.g. homogeneity) of the bulk material and the accuracy desired for estimating the properties of the bulk material.

Figure 1B:
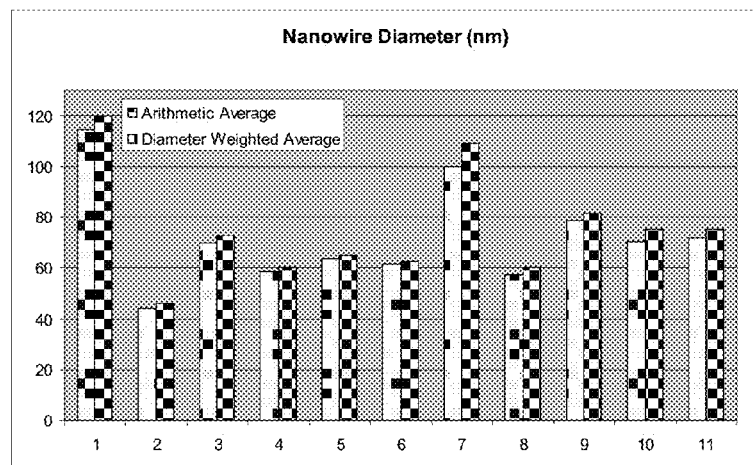
FIG. 1B is a bar graph depicting average nanowire diameter of 11 different samples wherein the average nanowire diameter of each sample is determined by either arithmetic or diameter weighted calculations.
Figure 1C:
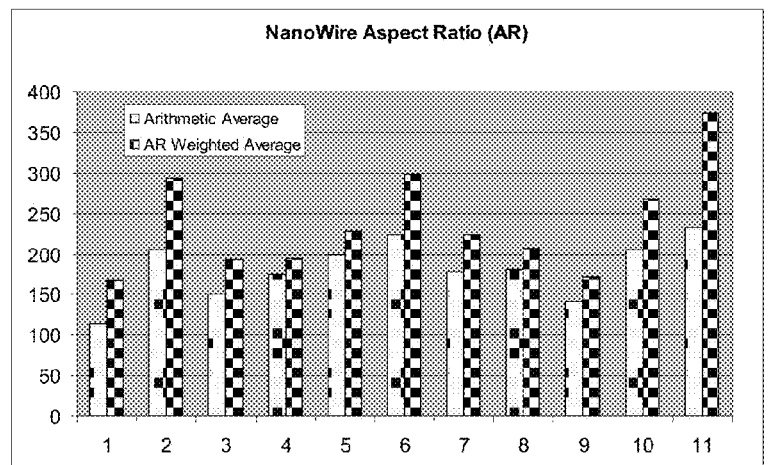
FIG. 1C is a bar graph depicting average aspect ratio of 11 different samples wherein the average aspect ratio of each sample is determined by either arithmetic or aspect ratio weighted calculations.

With reference to FIG. 1A, (the 'Nanowire Length' plot) the legend titled "Arithmetic Average" (unweighted mean) is the average length of the measured nanowire population. With reference to FIG. 1B, (the 'Nanowire Diameter' plot), the legend titled "Arithmetic Average" (unweighted mean) is the average diameter of the measured nanowire population. With reference to FIG. 1C, (the 'Nanowire Aspect Ratio' plot), the legend titled "Arithmetic Average" (unweighted mean) is the average aspect ratio of the measured nanowire population. The aspect ratio is determined by dividing the average length of the nanowire population (from FIG. 1A for each illustrated sample) by the average diameter of the nanowire population (from FIG. 1B for each illustrated sample).

Alternatively, the aspect ratio can be calculated from the Figures as follows: With reference to FIG. 1A, (the 'Nanowire Length' plot), the legend titled "Length Weighted Average" is determined by first taking the length of each nanowire and dividing it by the sum of the lengths of all nanowires measured to form a weight ($w_l$) which is the percent contribution of the single nanowire to the sum length of all nanowires (we defined this number for each nanowire to be the % length). Then for each nanowire we take the length of the nanowire and multiply it by its respective $w_l$ (% length) (defined as the "Percent Effective Length"). The Length Weighted Average plotted in FIG. 1A is the sum total of the Percent Effective Length for all of the measured nanowires.

With reference to FIG. 1B, (the 'Nanowire Diameter' plot), the legend titled "Diameter Weighted Average" is determined by first taking the diameter of each nanowire and dividing it by the sum of the diameters of all nanowires measured to form a weight $w_d$, which is the percent contribution of the single nanowire to the sum diameter of all nanowires (we defined this number for each nanowire to be the % diameter). Then for each nanowire we take the diameter of the nanowire and multiply it by its respective $w_d$ (% diameter) (defined as the "Percent Effective Diameter"). The Diameter Weighted Average plotted in FIG. 1B represents the sum total of the Percent Effective Diameter for all of the measured nanowires.

With reference to FIG. 1C, (the 'Nanowire Aspect Ratio' plot), the legend entitled "AR Weighted Average" is the Length Weighted Average (see above) divided by the Diameter Weighted Average (see above).

Figure 1D:
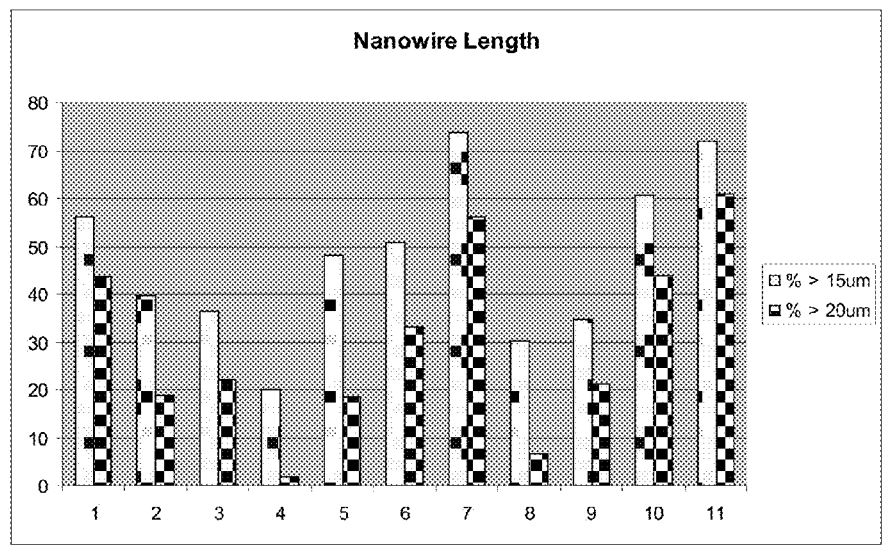
FIG. 1D is a bar graph depicting the percentage of nanowires having a length greater than 15 μm or 20 μm for each of 11 different samples as determined by length weighted average.
Figure 1E:
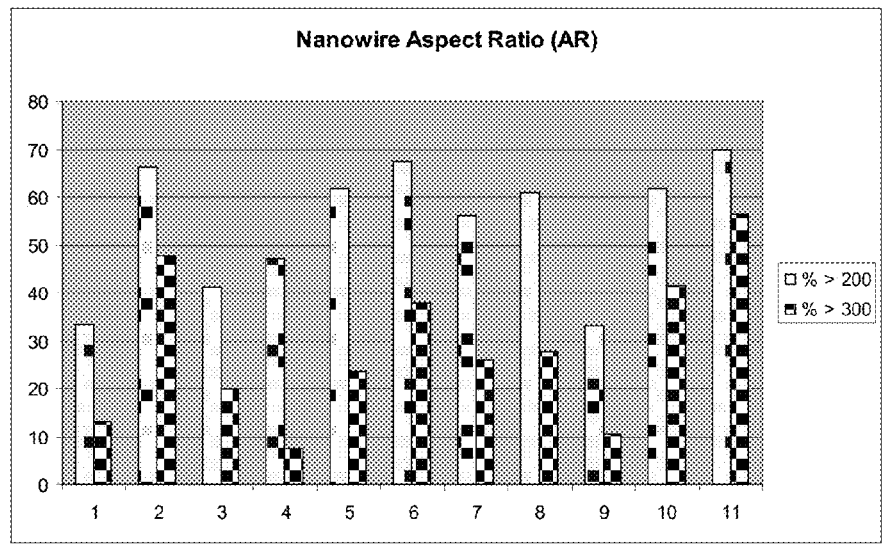
FIG. 1E is a bar graph depicting the percentage of nanowires having an aspect ratio greater than 200 or 300 for each of 11 different samples as determined by aspect ratio weighted average.

With reference to FIG. 1D, the percentage of silver nanowires in each of the 11 different samples referred to in FIG. 1A-1C that are greater than 15 μm or 20 μm is illustrated. Similarly, in FIG. 1E the percentage of silver nanowires in each of the 11 different samples referred to in FIG. 1A-1C with aspect ratios greater than 200 and greater than 300 is illustrated.

It is to be understood that the foregoing discloses two of numerous possible methods for determining the average aspect ratio of bulk material. However, for the purposes of interpreting the disclosure provided herein, aspect ratios of bulk material are determined according to these methods and in particular with reference to aspect ratio as determined by weighted average. This includes determining the aspect ratio of nanostructures in the recovered product, which in practice have been determined using the above described method to analyze the bulk nanowires recovered from the product solution.

Using the above described methods, aspect ratios for bulk silver nanowires of at least 150, at least 200, at least 250, at least 300, at least 500, at least 750, at least 1000, at least 1500 or at least 2000 can be determined. In one representative synthesis disclosed herein, silver nanowires having aspect ratios higher than 3000 were prepared.

As used herein with respect to practice of the methods, the terms 'added', 'mixed' or 'combined' are generally interchangeable and refer to the act of adding, mixing or combining one or more of the reactants with one or more other reactants. This can occur by adding reactants to, or mixing or combining the reactants in, the reaction vessel and/or with each other.

As used herein, 'halide ion' refers to fluoride ion, chloride ion, bromide ion or iodide ion.

As used herein 'nanocube' refers to a nanostructure having a shape that is roughly cubic (i.e. has approximately the same height, width and depth dimensions). The corners of the cubic structure may be pointed or slightly rounded.

As used herein, 'nanoparticle' refers to a nanostructure or a collection of nanostructures that are not nanopyramids, nanowires, nanorods or nanocubes.

As used herein, 'nanopyramid' or 'bipyramid' refers to a nanostructure that resembles a three faced pyramid (See: Wiley et al., *Maneuvering the Surface Plasmon Resonance of Silver Nanostructures through Shape-Controlled Synthesis*, J. Phys. Chem. B., 110: 15666-15675 (2006) at FIGS. 5B and 5C).

As used herein, 'nanorods' refers to nanostructures having an elongated shape wherein the length and diameter dimension produce aspect ratios of between 2 and less than 10.

As used herein 'nanostructure' refers to any of the various structures of the metal formed in the polyol process wherein one of the dimensions is less than 1000 nm. In some preferred embodiments, the smallest dimension is less than 500 nm, is less than 250 nm or even less than 100 nm. Examples of nanostructures include, but are not limited to, nanoparticles, nanopyramids, nanorods, nanocubes, nanobeams, nanobelts, nanoplates, nanocables and nanowires.

As used herein, 'nanowire' refers to a nanostructure wherein the length and diameter dimension produce aspect ratios of at least 10. For example, a nanowire having a length of 30,000 nanometer (30 μm) and a diameter of 50 nanometers would have an aspect ratio of 600 (30,000/50=600).

As used herein, 'weight percent' or 'wgt %' refers to percent by weight or mass. For example, the phrase 'at least 10 weight percent (10 wgt %) silver nanowires as compared with a weight percent of all other silver nanostructures in the product solution' refers to calculating, as a percentage, a fraction represented by the weight or mass of all silver nanowires present in the product solution divided by the weight or mass of all other silver nanostructures present in the product solution. Although real-time monitoring of the reaction may permit this analysis (See: Reyes-Gasga et al., *On the structure of nanorods and nanowires with pentagonal cross-sections*, Journal of Crystal Growth, 286: 162-172 (2006); Wiley et al., *Maneuvering the Surface Plasmon Resonance of Silver Nanostructures through Shape-Controlled Synthesis*, J. Phys. Chem. B., 110: 15666-15675 (2006); or Wiley et al., *Synthesis of Silver Nanostructures with Controlled Shapes and Properties*, Acc. Chem. Res., 40: 1067-1076 (2007)), in practice this can also (more practically) be determined by calculating (determining) the weight of silver nanowires isolated from the reaction divided by the theoretical weight of all silver metal that could be produced (and thereby exist as silver nanostructures) by the reaction.

As used herein, 'product solution' refers to the solution comprising the entirety of all the reactants before any dilution or concentration is performed.

As used herein, 'reactant' refers to a compound or solution comprising a compound that reacts in the reaction or that is capable of influencing the abundance of nanowires (or nanostructures) formed. In embodiments of this invention, reactants include, but are not necessarily limited to, the polyol (or polyols), the silver compound(s), the organic protective agent(s), an acid compound (or compounds), the compound(s) that comprise halide ion (e.g. NaCl) and/or the compound(s) that comprise Fe(II) and/or Fe(III) either as solids, liquids, gases or in solution.

As used herein 'reaction temperature' refers to the temperature of the heat source applied to the reaction vessel or the actual temperature of the reaction mixture during the reaction as determined by direct monitoring. For example, the reaction temperature can be the temperature of an oil bath used to heat the vessel containing all the reactants of a polyol reaction or could be the temperature of the reaction mixture as determined by a thermometer or thermocouple inserted into said reaction mixture.

As used herein, 'reaction mixture' refers to both the mixture of reactants as fully combined as well as to a mixture to which one or more of the reactants is being added but to which at least a portion of all the reactants has been added such that the reaction can begin. For example, in the polyol process, it is common to add dropwise the silver solution and a solution comprising the organic protective agent into a vessel comprising polyol. From the time the first drops of silver solution and solution comprising the protective agent mix with the polyol in the vessel, the reaction has begun despite the fact that not all of each of the reactants has yet been combined. Thus, according to this definition, the vessel comprising the drops of silver solution, solution comprising the organic protective agent and the polyol is a reaction mixture.

4. General

It is to be understood that the discussion set forth below in this "General" section can pertain to some, or to all, of the various embodiments of the invention described herein.

Polyol(s)

The polyol is selected to be capable of reducing the silver compound to silver metal at the reaction temperature when present in the reaction mixture. The polyol can also be selected for its ability to dissolve the silver compound to thereby produce the silver solution that is often combined according to the polyol process. The polyol can also be selected based upon its ability to influence the formation of silver nanowires over other silver nanostructures under the reaction conditions. The polyol can also be selected for its ability to dissolve the organic protective agent as described infra. The foregoing criteria are not mutually exclusive such that, the polyol is typically selected based on a consideration of all of the foregoing criteria.

The polyol may be a single polyol or a mixture of two or more polyols (e.g. three, four, five or more polyols). Whenever the term "polyol" is used herein, this term is meant to include both a single polyol and a mixture of two or more polyols unless used as part of the phrase "polyol or polyols" or "polyol(s)" (both of which include the singular and plural version of this term) or where use of the singular term is clearly intended or required.

The polyol may have any number of hydroxyl groups (but at least two) and carbon atoms provided that it comprises 2 or more hydroxyl groups. Also, the polyol may comprise heteroatoms (such as, e.g., O and N); not only in the form of hydroxyl groups, but also in the form of, e.g., ether, ester, amine and/or amide groups and the like (for example, the polyol may be a polyester polyol, a polyether polyol, etc.). A polyol can be either an aliphatic glycol or a corresponding glycol polyester. Said aliphatic glycol, for instance, can be an alkylene glycol having up to 6 carbon atoms in the main chain. Examples include ethanediol, a propanediol, a butanediol, a pentanediol or a hexanediol, as well as polyalkylene glycols derived from these alkylene glycols.

In some embodiments, the polyol comprises from about 2 to about 6 hydroxy groups (e.g., 2, 3 or 4 hydroxy groups) and from 2 to about 12 carbon atoms (e.g., 3, 4, 5 or 6 carbon atoms). The (alkylene) polyol can be a glycol, i.e., compounds which comprise two hydroxyl groups bound to adjacent (aliphatic or cycloaliphatic) carbon atoms. For example, the glycols can comprise up to about 6 carbon atoms, e.g., 2, 3 or 4 carbon atoms. Some useful polyols include glycerol, trimethylolpropane, pentaerythritol, triethanolamine and trihydroxymethylaminomethane.

In some embodiments, a polyol can be ethylene glycol, diethylene glycol, tri-ethylene glycol, a propylene glycol, a butanediol, a dipropylene glycol or a polyethylene glycol that is liquid at the reaction temperature, such as for example, polyethylene glycol 300. Other useful polyols include tetra-ethylene glycol, propanediol-1,2, di-propylene glycol, butanediol-1,2, butanediol-1,3, butanediol-1,4 and butanediol-2,3. The use of these glycols is advantageous because of their significant reducing power, their boiling temperature of between 185° C. and 328° C., their proper thermal stability and their low cost price. Furthermore, these glycols raise few toxicity problems.

Another non-limiting grouping of polyols suitable for use in the process of the present invention includes: ethylene glycol, glycerol, glucose, diethylene glycol, tri-ethylene glycol, a propylene glycol, a butanediol, a dipropylene glycol and/or a polyethylene glycol.

Of course, it also is possible to use other polyols than those mentioned above, either alone or in combination. For example, sugars and sugar alcohols can form at least a part of the polyol reactant. While polyols that are solid or semi-solid at room temperature may be employed, the employed polyol or at least the employed mixture of polyols will generally be liquid at room temperature and at the reaction temperature, although this is not mandatory.

From an economic and environmental standpoint, it is interesting to note that the polyols can often be re-used. For example, the polyols can usually be recaptured and used again in other reactions or else they can be purified by distillation or crystallization prior to reuse.

According to embodiments of the present invention the polyol and the associated reaction conditions are selected to preferentially produce silver nanowires as compared with other nanostructures. Thus, using no more than the guidance provided herein and routine experimentation, one of skill in the art will be able to select polyols that can be used (according to the presently disclosed inventive methods) to selectively produce silver nanowires.

Silver Compound

The silver compound is the source of the silver metal that produces the silver nanostructures according to the polyol method. In general, the silver compound can be any silver compound that produces silver metal when reduced. If the silver compound is to be used dissolved in a solution, it should be at least partially soluble in the silver solvent and/or polyol. Complete solubility is not required because suspensions can be used. Whether used in solution, as a suspension or in solid form any counterion (e.g. anion) should not interfere with the reduction reaction. Whenever the term 'silver compound' is used herein, this term is meant to include either a single silver compound or a mixture of two or more silver compounds unless use of the singular term is clearly intended or required.

According to the polyol method, the silver compound is reduced by the polyol (and/or by supplemental reducing agents) to thereby produce silver metal in-situ. The silver metal that is formed, depending on the reaction conditions employed (See: Wiley et al., *Maneuvering the Surface Plasmon Resonance of Silver Nanostructures through Shape-Controlled Synthesis, J. Phys. Chem. B.,* 110: 15666-15675 (2006)), produces various types of silver nanostructures. According to various embodiments of the present invention, the silver compound, other reactants and the associated reaction conditions are selected to preferentially produce silver nanowires as compared with other nanostructures.

The silver compounds that may be used in various embodiments of the present invention include all silver compounds that a polyol (and/or any supplemental reducing agents) can reduce to the corresponding silver metal (oxidation state=zero). Since the silver compound is typically (but not necessarily since it can be added to the reaction as a solid) combined with other reactants as a silver solution, it will often (but not necessarily) be selected to be soluble to at least some extent in at least one solvent (i.e. the 'silver solvent'). Characteristics, properties and exemplary silver solvents are described herein. In various embodiments, the silver compound is dissolved in the polyol. Thus, the silver compound is usually selected to be soluble to at least some extent in the polyol (other solvent or mixture of polyol and other solvent(s)) at room temperature and at the reaction temperature so that there is no substantial precipitation or other separation of the silver compound (as compared with the silver metal) from the liquid phase when the silver solution is combined with the other reactants; one or more of which may be at any suitable temperature (e.g. from room temperature to the reaction temperature or even above the reaction temperature).

So long as it does not preclude production of the selected nanostructure (e.g. nanowires), there is not any particular limitation on the amount of silver compound that can be used since, as the silver compound is consumed, it is converted to silver metal. Moreover, the silver compound can be used in solid form or be dissolved to produce a silver solution. However, since saturated solutions and even suspensions can be used, there is not generally a limitation on the amount of silver that can be used except for the amount that can be contained within the product solution without interfering with mixing during the reaction. Although not an absolute limitation, in practice the concentration of silver (either as an ion or as metal) in the product solution can be; in the range of about 75 mmolar to about 500 mmolar, in the range of about 95 mmolar to about 330 mmolar or in the range of about 130 mmolar to about 200 mmolar. In practice, these concentrations can be determined based upon moles of silver added to the reaction divided by the total volume of all reactants. These concentration ranges include concentrations that are far higher than have been used in other reported preparations.

In general, the silver compound can be a silver oxide, a silver hydroxide or a silver salt (organic or inorganic). Non-limiting examples of suitable silver compounds include silver salts of inorganic and organic acids such as, e.g., nitrates, nitrites, sulfates, halides (e.g., fluorides, chlorides, bromides and iodides), carbonates, phosphates, azides, borates (including fluoroborates, pyrazolylborates, etc.), sulfonates, carboxylates (such as, e.g., formates, acetates, propionates, oxalates and citrates), substituted carboxylates (including halogenocarboxylates such as, e.g., trifluoroacetates, hydroxycarboxylates, am inocarboxylates, etc.) and salts and acids wherein the silver is part of an anion (such as, e.g., hexachloroplatinates, tetrachloroaurate, tungstates and the corresponding acids) as well as combinations of any two or more of the foregoing. Further non-limiting examples of suitable silver compounds for the process of the present invention include alkoxides, complex compounds (e.g., complex salts) of silver such as, e.g., beta-diketonates (e.g., acetylacetonates), complexes with amines, N-heterocyclic compounds (e.g., pyrrole, aziridine, indole, piperidine, morpholine, pyridine, imidazole, piperazine, triazoles, and substituted derivatives thereof), aminoalcohols (e.g., ethanolamine, etc.), amino acids (e.g., glycine, etc.), amides (e.g., formamides, acetamides, etc.), and nitriles (e.g., acetonitrile, etc.) as well as combinations of any two or more of the foregoing. In some embodiments, the silver compound is selected such that the reduction by-product is volatile and/or can be decomposed into a volatile by-product at a relatively low temperature.

Another non-limiting grouping of silver compounds suitable for use in the process of the present invention includes: silver nitrate, silver nitrite, silver oxide, silver fluoride, silver hydrogen fluoride, silver carbonate, silver oxalate, silver azide, silver tetrafluoroborate, silver acetate, silver propionate, silver butanoate, silver ethylbutanoate, silver pivalate, silver cyclohexanebutanoate, silver ethylhexanoate, silver neodecanoate, silver decanoate, silver trifluoroacetate, silver pentafluoropropionate, silver heptafluorobutyrate, silver trichloroacetate, silver 6,6,7,7,8,8,8 heptafluoro-2,2-dimethyl-3,5-octanedionate, silver lactate, silver citrate, silver glycolate, silver glyconate, silver benzoate, silver salicylate, silver phenylacetate, silver nitrophenylacetate, silver dinitrophenylacetate, silver difluorophenylacetate, silver 2-fluoro-5-nitrobenzoate, silver acetylacetonate, silver hexafluoroacetylacetonate, silver trifluoroacetylacetonate, silver tosylate, silver triflate, silver trispyrazolylborate, silver tris(dimethylpyrazolyl)borate, silver beta-diketonate olefin complexes and silver cyclopentadienides as well as combinations of any two or more of the foregoing.

Another non-limiting grouping of silver compounds suitable for use in the process of the present invention includes: silver nitrate, silver nitrite, silver oxide, silver fluoride, silver hydrogen fluoride, silver carbonate, silver oxalate, silver azide, silver tetrafluoroborate, silver acetate, silver propionate, silver butanoate, silver ethylbutanoate or silver pivalate as well as combinations of any two or more of the foregoing.

In some embodiments, the silver compound is silver nitrate ($AgNO_3$). In some embodiments, the silver compound is silver acetate.

According to embodiments of the present invention the silver compound and the associated reaction conditions are selected to preferentially produce silver nanowires as compared with other nanostructures. Thus, using no more than the guidance provided herein and routine experimentation, one of skill in the art will be able to select silver compounds (in appropriate amounts and/or concentrations (as appropriate)) that can be used to produce silver nanowires.

Silver Solution

The production of silver nanostructures, including silver nanowires, via the polyol method commonly (but not necessarily) involves combining a silver solution comprising the silver compound (or silver compounds) with the one or more other reactants. According to some embodiments of this invention, it is not a requirement that the silver compound be added to the reaction in solution as it may be added in solid form (i.e. as a solid powder) or as a suspension. However, as used herein 'silver solution' refers to a solution comprising the silver compound that is prepared for addition as a reactant to the reaction mixture. As suggested above, the silver compound may not always dissolve completely or even substantially such that the silver solution is more accurately characterized as a suspension of silver compound in the silver solvent. As used herein, 'silver solution' is intended to encompass silver suspensions as well as solutions where the silver compound is completely dissolved or essentially completely dissolved.

The solvent used to dissolve the silver compound to thereby form the silver solution may be a single solvent or a mixture of two or more solvents (individually or collectively (as appropriate) referred to herein as 'silver solvent'). For example, in some embodiments, the silver solvent is the polyol (i.e. a single polyol or a mixture of polyols). In some embodiments, the silver solvent is a mixture of the polyol and one or more other solvents that, for example, may be selected because the silver compound is more soluble in this solvent or these solvents. In some embodiments, the silver solvent does not comprise the polyol but rather comprises one or more other solvents that, for example, may be selected because the silver compound is more soluble in the selected solvent or solvents than it is in the polyol.

As suggested above, in some embodiments, the silver solvent can be selected to dissolve a significant amount, or all, of the silver compound at room temperature and/or at the temperature that the silver solution is intended to have when it is combined (e.g. mixed) with the one or more of the other reactants. In some embodiments, the silver solvent can dissolve the silver compound at room temperature in an amount of at least about 1 gram per liter (g/L) of silver solvent. In some embodiments, the silver solvent can dissolve the silver compound at room temperature in an amount of at least about 5 g/L, or at least about 10 g/L. In some embodiments, the silver compound dissolves in the silver solvent in an amount of at least about 50 g/L, e.g., at least about 100 g/L, at least about 200 g/L, at least about 300 g/L, at least about 500 g/L or at least about 1000 g/L. In this regard, it is to be appreciated that one or more components of the silver solvent may be poor solvents for the silver compound provided that the entirety of the solvent is capable of dissolving the silver compound to the desired extent.

In some embodiments, the concentration of the silver compound in silver solution is in the range of about 0.1 molar to about 3.0 molar. In some embodiments, the molar concentration of the silver compound in silver solution is in the range of about 0.25 molar to about 2.5 molar. In some embodiments, the molar concentration of the silver compound in silver solution is in the range of about 0.3 molar to about 3.0 molar. In some embodiments, the molar concentration of the silver compound in silver solution is in the range of about 0.5 molar to about 3.0 molar. In some embodiments, the molar concentration of the silver compound in silver solution is in the range of about 0.5 molar to about 5.0 molar. In some embodiments, the molar concentration of the silver compound in silver solution is in the range of about 0.1 molar to about 5.0 molar. In some embodiments, the molar concentration of the silver compound in silver solution is in the range of about 1.0 molar to about 5.0 molar.

It is to be understood that in some embodiments the silver solution may still contain some undissolved silver compound (e.g. it is a suspension). In some embodiments, it may be particularly advantageous to employ a highly concentrated, and in particular a saturated or substantially saturated, solution of the silver compound. Use of a saturated solution can permit a smaller temperature drop in the reaction mixture during the combining (mixing step) where, for example, the reaction vessel comprising one or more of the reactants is heated and the silver solution is at room temperature when added (i.e. combined or mixed) with other reactants.

Solvents, other than the polyol, that may be used to produce the silver solution include protic and aprotic polar solvents that are non-oxidative. Non-limiting examples of such solvents include aliphatic, cycloaliphatic and aromatic alcohols (the term "alcohol" as used herein is used interchangeably with the terms "monoalcohol" and "monohydric alcohol") such as, e.g., ethanol, propanol, butanol, pentanol, cyclopentanol, hexanol, cyclohexanol, octanol, decanol, isodecanol, undecanol, dodecanol, benzyl alcohol, butyl carbitol and the terpineols, ether alcohols such as, e.g., the monoalkyl ethers of diols such as, e.g., the $C_{1-6}$ monoalkyl ethers of $C_{1-6}$ alkanediols and polyetherdiols derived therefrom (e.g., the monomethyl, monoethyl, monopropyl and monobutyl ethers of ethylene glycol, diethylene glycol, triethylene glycol, propylene glycol, dipropylene glycol, 1,3-propanediol, and 1,4-butanediol such as, e.g., 2-methoxyethanol, 2-ethoxyethanol, 2-propoxyethanol and 2-butoxyethanol), aminoalcohols such as, e.g., ethanolamine, amides such as, e.g., dimethylformamide, dimethylacetamide 2-pyrrolidone and N-methylpyrrolidone, esters such as, e.g., ethyl acetate and ethyl formate, sulfoxides such as, e.g., dimethylsulfoxide, ethers such as, e.g., tetrahydrofuran and tetrahydropyran, and water.

The silver solvent can be selected based on the nature of the silver compound. In some embodiments, the silver solvent is of high purity, but this is not a requirement. Various publications have suggested that solvent impurities can affect the characteristics and properties of nanostructures produced by synthesis according to the polyol method (e.g.: Wiley et al., *Nano Letters*, 4(9): 1733-1739 (2004) at endnote 5, Wiley et al, *Langmuir*, 21(18): 8077-8080 (2005) at page 8080, col. 2). It is not essential that the solvent or solvents used to produce the silver solution be highly pure. However, the amount of impurities such as halide ion (e.g. chloride ion) and iron (e.g. Fe(II) or Fe(III)) in the solvent should be known so that the amount of these impurities in the reaction mixture can be controlled where the presence of these impurity compounds influence the nature of the nanostructures produced. (See infra under the heading: Optional Reactants)

In some embodiments, the silver solution is made fresh on the day that the reaction is performed. This is more likely to occur when the silver solvent is a polyol or otherwise contains compounds that can reduce the silver compound to silver metal. In brief, a freshly prepared solution of the silver compound dissolved in polyol is less likely to contain prematurely reduced silver compound to silver metal.

Accordingly, using no more than the disclosure provided herein and routine experimentation, one of skill in the art, will be able to select appropriate solvent or solvents suitable for preparing the silver solution at the appropriate concentration. This applies also to any other solvents that may be used in the various embodiments of the present invention. Thus, in some embodiments, the silver solvent, other solvents and the associated reaction conditions may be selected to preferentially produce silver nanowires as compared with other nanostructures.

Temperature of the Silver Solution

The temperature of the silver solution may, at least in part, depend on the nature of the silver solvent. In addition to the potential for prematurely reducing the silver compound to silver metal, other factors should be considered when determining the temperature of the silver solution. For example, too low a temperature may increase the viscosity of the solution and/or reduce the solubility of the silver compound to an undesirable degree. Too low a temperature may also significantly lower the reaction temperature or the temperature of other reactants when the silver solution is combined with the other reactants. Thus, the ordinary practitioner will appreciate that the temperature of the silver solution during storage and at the time when it is combined with the other reactants can be selected to influence the product of the polyol reaction.

If the silver solvent is a polyol or comprises a polyol, the silver solution can be maintained at or below 50° C.; at or below 40° C., at or below 30° C. or at ambient temperature. A temperature above 50° C. is not prohibited but it should be kept in mind that a lower temperature reduces the reaction rate of the reductive conversion of the silver compound to silver metal. The length of time the silver solution is to be stored before it is used is also a consideration. If the silver solution need be stored before it is used, it can be kept cool (even below ambient temperature) under conditions that prevent (or minimize) the silver compounds' reduction and then warmed to the appropriate temperature before use.

If the silver solvent does not comprise a polyol and does not contain a reducing agent or reducing agents, the temperature of the silver solution can be elevated above ambient temperature to, for example, increase the solubility of the silver compound and/or to avoid a large drop in reaction temperature when the silver solution is combined with the other reactants. If the solvent does contain a polyol, then for a very short time, the temperature of the silver solvent may be elevated. Thus, in some embodiments, the temperature of the silver solution can be about room temperature. In some embodiments the temperature of the silver solution can be higher than ambient temperature or even significantly above ambient temperature. In some embodiments, the silver solution can be heated to the intended reaction temperature, or above this temperature, so that combining the silver solution with one or more of the other reactants does not result in a substantial decrease in the reaction temperature of the reaction mixture. By "substantial decrease" we mean a decrease in the reaction temperature of at least 5° C.

For example, in some embodiments, the temperature of the silver solution can be 50° C. or above. In some embodiments, the temperature of the silver solution can be 60° C. or above; can be 70° C. or above, can be 80° C. or above, can be 90° C. or above, can be 100° C. or above, can be 110° C. or above, can be 120° C. or above, can be 130° C. or above or can be 140° C. or above.

Accordingly, in some embodiments those of skill in the art, using no more than knowledge available to the ordinary practitioner, the disclosure provided herein and routine experimentation, can select an appropriate temperature for the silver solution to preferentially produce silver nanowires as compared with other nanostructures.

Organic Protective Agent(s) (OPA)

The organic protective agent was originally introduced into the polyol mediated preparation of nanostructures to avoid particle sintering (See for example: Ducamp-Sanguesa et al. *Journal of Solid State Chemistry*, 100: 272-280 (1992)). More recent literature has suggested that particle morphology is at least in part dependent on the ratios of the organic protective agent (i.e. poly(vinyl pyrrolidone as used in the cited reference) to the silver compound (i.e. $AgNO_3$ as used in the cited reference) and well as the nature of the organic protective agent (See: Sun et al., *Adv. Mater.* 14(11): 833-837 (2002)). According to Vanheusden et al. (US 2007/0034052 A1), one of the other functions of the organic protective agent (referred to by them as the 'Absorptive Substance') is that it is capable of being absorbed onto the metal nanostructure. While Applicants do not intend to be bound to any theory as to how the organic protective agent acts in the polyol mediated synthesis of silver nanowires, it is one of the reactants that is combined (e.g. mixed) according to various embodiments of the invention disclosed herein. Further features and characteristics of the organic protective agent and exemplary compounds are described in more detail infra.

Whenever the term 'organic protective agent' is used herein, this term is meant to include either a single organic protective agent or a mixture of two or more organic protective agents unless use of the singular term is clearly intended or required.

In the scientific and patent literature several other phrases have been used as a substitute for the term 'organic protective agent'. Examples of alternative phrases include: 'protective agent' (See: Silvert et al., *J. Mater. Chem.*, 6(4): 573-577 (1996), 'coordination compound' (See: Sun et al., *Chem. Mater.*, 14: 4736-4745 (2002), 'polymer capping agent' 'polymeric capping agent', 'capping agent' or 'capping reagent' (See for example: Sun et al., *Nano Letters*, 3(7): 955-960 (2003), and 'soft template' (See: US 2007/0034052 A1). Use of the phrase 'organic protective agent' or 'protective agent' herein is intended to encompass all these other various phrases as well as other reactants known in the art that are added to the polyol synthesis of metal nanostructures to thereby reduce and/or prevent sintering (e.g. particle agglomeration).

In particular, it is thought that the organic protective agent acts to shield (e.g., sterically and/or through charge effects) the nanostructures and nanoparticles from each other to at least some extent and thereby reduce and/or prevent a direct contact between the individual nanostructures. In order to be effective, interaction between the organic protective agent and a nanostructure surface (e.g., the metal atoms on the surface of a nanoparticle) may manifest itself in an at least weak interaction between the organic protective agent and the surface of a nanostructure. In some embodiments, the interaction may be strong enough for the nanostructure-organic protective agent combination to withstand a washing operation with a solvent. In other words, merely washing the nanostructures with the solvent at room temperature is not likely to remove more than minor amounts (e.g., less than about 10%, less than about 5%, or less than about 1%) of that part of the organic protective agent that is in direct contact with (and perhaps weakly bonded to) the nanostructure surface. Of course, organic protective agent that is not in direct contact with a nanostructure surface and is merely associated with the bulk of the nanostructures as a contaminant (i.e., without any significant interaction with the nanostructures), can be removed from the nanostructures by washing the latter with a solvent. Further, in general the interaction between the organic protective agent and nanostructure should not be too strong and should be reversible under defined conditions. In addition to the organic protective agent's interaction with the silver metal, the organic protective agent may react with or reduce the silver compound during the reaction. This activity is not a problem as long as it does not interfere with the production of desired nanostructures, such as silver nanowires.

In some embodiments, the organic protective agent can be a liquid. In such cases it may be combined (mixed) with other reactants directly or it may be first diluted by mixing with a solvent or mixture of solvents (referred to herein as the "OPA solvent") that may or may not include the polyol. In some embodiments, the organic protective agent may be a solid which is first dissolved in the OPA solvent before being combined (e.g. mixed) with the other reactants. As with the silver solution, it is not essential that all of the organic protective agent dissolve in the OPA solvent. In some embodiments, a suspension of the organic protective agent can be used.

In some embodiments, the OPA solvent is the polyol or a mixture of the polyol and one or more other solvents. The one or more other solvents (that are not the polyol) may be selected to dissolve the organic protective agent, either alone or as a mixture (including mixtures with the polyol). There is no particular limitation on the OPA solvent so long as it does not inhibit or prevent the solution mediated production of desired nanostructures, such as silver nanowires.

It is not a requirement that the organic protective agent be added to the reaction in solution as it may be added in solid form (a solid powder). However, as used herein 'OPA solution' refers to a solution comprising the organic protective agent that is prepared for addition as a reactant to the reaction mixture. As suggested above, the organic protective agent may not always dissolve completely or even substantially such that the resulting solution is more accurately characterized as a suspension rather than a solution. As used herein, 'OPA solution' is intended to encompass suspensions as well as solutions where the organic protective agent is completely dissolved or essentially completely dissolved in the OPA solvent.

The organic protective agent is generally selected to not react with the polyol or any other solvent to any significant extent, even at the reaction temperature. Any solvent used to dissolve the organic protective agent should also be selected so that it does not inhibit or prevent the solution mediated production of desired nanostructures, such as silver nanowires. If the reaction mixture at the reaction temperature does not comprise any other solvent for the organic protective agent, the organic protective agent should also dissolve in the polyol to at least some extent. For example, the organic protective agent may have a solubility at room temperature of at least about 1 g per liter of solvent (including solvent mixtures), e.g., at least about 5 g per liter of solvent, at least about 10 g per liter of solvent, or at least about 20 g per liter of solvent. In some embodiments, the organic protective agent has a solubility of at least about 100 g per liter of solvent, e.g., at least about 200 g per liter of solvent or at least about 300 g per liter of solvent.

The concentration of solutions of the organic protective agent can be made to any concentration that is feasible and produces the desired nanostructures, such as silver nanowires, in the reaction. Generally, the limitation on solution concentration is the solubility of the organic protective agent in the solvent (including mixture of solvents) selected. In some embodiments, the organic protective agent is added to the reaction as an OPA solution comprising the organic protective agent in an OPA solvent, wherein the concentration of the organic protective agent in the solution is: in the range of about 0.025 molar to about 5.0 molar. In some embodiments, the molar concentration of a solution of the organic protective can be: in the range of about 0.1 molar to about 5.0 molar, in the range of about 0.15 molar to about 3.0 molar, in the range of about 0.2 molar to about 2.0 molar, in the range of about 0.5 molar to about 3.0 molar, in the range of about 0.5 molar to about 5.0 molar, in the range of about 1 molar to about 5.0 molar, in the range of about 1 molar to about 3.0 molar or in the range of about 1.5 molar to about 5.0 molar.

It is to be understood that, for example, when a polymer like polyvinylpyrrolidone (PVP), having an average molecular weight of, for example, 55,000 is used as the organic protective agent, the concentration is calculated using the monomer weight and not the average molecular weight of the polymer. For example, the molar concentration of PVP solution would be calculated by dividing the grams of PVP used to make the OPA solution by 111 g/mole and not by 55,000 g/mole.

As discussed supra, the present invention also contemplates the use of two or more different types of organic protective agents being used together. For example, a mixture of two or more different low molecular weight compounds or a mixture of two or more of the same or different polymers may be used where if the same, the polymers are of different molecular weight. In some embodiments, a mixture of one or more low molecular weight compounds and one or more polymers can be used. For example, the organic protective agent can be a mixture of polymers having an approximate molecular weight (e.g. poly(vinyl pyrrolidone) having an approximate molecular weight of 55,000). In some embodiment, the organic protective agent can be a mixture comprising one or more of these commercially available polymer mixtures. For example, the organic protective agent may comprise poly(vinyl pyrrolidone) having an average molecular weight of 55,000 and poly(vinyl pyrrolidone) having an average molecular weight of 1,300,000). In some embodiments, the organic protective agent may comprise a mixture of different polymers. For example the organic protective agent may comprise poly(vinyl pyrrolidone) having an average molecular weight of 55,000 and poly(vinyl alcohol) having an average molecular weight of 35,000.

In some embodiments, the organic protective agent is a substance that is capable of electronically interacting with a metal atom of a nanoparticle. Such a substance can comprise one or more atoms (e.g., at least two atoms) with one or more free electron pairs such as, e.g., oxygen, nitrogen and sulfur. By way of non-limiting example, the organic protective agent may be capable of a dative interaction with a metal atom on the surface of a nanoparticle and/or of chelating the metal atom. For example, the organic protective agents can comprise one or two O and/or N atoms. The atoms with a free electron pair can be present in the substance in the form of a functional group such as, e.g., a hydroxy group, a carbonyl group, an ether group and an amino group, or as a constituent of a functional group that comprises one or more of these groups as a structural element thereof. Non-limiting examples of suitable functional groups include —COO—, —O—CO—O, —CO—O—CO—, —C—O—C—, —CONR—, —NR—CO—O—, —NR$^1$—CO—NR$^2$—, —CO—NR—CO—, —SO$_2$NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms). Such functional groups may comprise the above (and other) structural elements as part of a cyclic structure (e.g., in the form of a cyclic ester, amide, anhydride, imide, carbonate, urethane, urea, and the like). In some embodiments, the organic protective agent is, or comprises, a substance that is capable of reducing the metal compound. A specific, non-limiting example of such a substance is poly(vinyl pyrrolidone) (PVP). As such PVP qualifies as a supplemental reducing agent as discussed infra under the heading 'Supplemental Reducing Agents'.

In some embodiments, the organic protective agent can have a total of at least about 10 atoms per molecule which are selected from C, N and O, e.g., at least about 20 such atoms or at least about 50 such atoms. In some embodiments, the organic protective agent has a total of at least about 100 C, N and O atoms per molecule, e.g., at least about 200, at least about 300, or at least about 400 C, N and O atoms per molecule. In the case of polymers these numbers refer to the average per polymer molecule.

The organic protective agent may comprise a low molecular weight organic compound, not higher than about 500. In some embodiments, the organic protective agent may not be higher than about 300 molecular weight. In some embodiments, the organic protective agent may comprise an oligomeric or polymeric compound. By way of non-limiting example, poly(vinyl pyrrolidone) having an average molecular weight in the range of from about 10,000 to about 1,300,000, is particularly useful for preparing silver nanowires. In some embodiments, poly(vinyl pyrrolidone) having an average molecular weight of 55,000 is selected.

Some non-limiting examples of organic protective agents that can be used alone or as mixtures include poly(vinyl pyrrolidone), poly(vinyl alcohol) and surfactants such as sodium dodecyl sulfate (SDS), laurylamine and hydroxypropyl cellulose.

Some non-limiting examples of the low molecular weight organic protective agent include fatty acids, in particular, fatty acids having at least about 8 carbon atoms. Non-limiting examples of oligomers/polymers for use as the organic protective agent include homo- and copolymers (including polymers such as, e.g., random copolymers, block copolymers and graft copolymers) which comprise units of at least one monomer which comprises one or more O atoms and/or one or more N atoms. A non-limiting class such polymers for use in the present invention is constituted by polymers which comprise at least one monomer unit which includes at least two atoms which are selected from 0 and N atoms. Corresponding monomer units may, for example, comprise at least one hydroxyl group, carbonyl group, ether linkage and/or amino group and/or one or more structural elements of formula: —COO—, —O—CO—O—, —CO—O—CO—, —C—O—C—, —CONR—, —NR—CO—O—, —NR$^1$—CO—NR$^2$—, —CO—NR—CO—, —SO$_2$NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms).

Some non-limiting examples of corresponding polymers that can be the protective agent include polymers which comprise one or more units derived from the following groups of monomers:

(a) monoethylenically unsaturated carboxylic acids of from about 3 to about 8 carbon atoms and salts thereof. This group of monomers includes, for example, acrylic acid, methacrylic acid, dimethylacrylic acid, ethacrylic acid, maleic acid, citraconic acid, methylenemalonic acid, allylacetic acid, vinylacetic acid, crotonic acid, fumaric acid, mesaconic acid and itaconic acid. The monomers of group (a) can be used either in the form of the free carboxylic acids or in partially or completely neutralized form. For the neutralization alkali metal bases, alkaline earth metal bases, ammonia or amines, e.g., sodium hydroxide, potassium hydroxide, sodium carbonate, potassium carbonate, sodium bicarbonate, magnesium oxide, calcium hydroxide, calcium oxide, ammonia, triethylamine, methanolamine, diethanolamine, triethanolamine, morpholine, diethylenetriamine or tetraethylenepentamine may, for example, be used;

(b) the esters, amides, anhydrides and nitriles of the carboxylic acids stated under (a) such as, e.g., methyl acrylate, ethyl acrylate, methyl methacrylate, ethyl methacrylate, n-butyl acrylate, hydroxyethyl acrylate, 2- or 3-hydroxypropyl acrylate, 2- or 4-hydroxybutyl acrylate, hydroxyethyl methacrylate, 2- or 3-hydroxypropyl methacrylate, hydroxyisobutyl acrylate, hydroxyisobutyl methacrylate, monomethyl maleate, dimethyl maleate, monoethyl maleate, diethyl maleate, maleic anhydride, 2-ethylhexyl acrylate, 2-ethylhexyl methacrylate, acrylamide, methacrylamide; N,N-dimethylacrylamide, N-tert-butylacrylamide, acrylonitrile, methacrylonitrile, 2-dimethylaminoethyl acrylate, 2-dimethylaminoethyl methacrylate, 2-diethylaminoethyl acrylate, 2-diethylaminoethyl methacrylate and the salts of the last-mentioned monomers with carboxylic acids or mineral acids;

(c) acrylamidoglycolic acid, vinylsulfonic acid, allylsulfonic acid, methallylsulfonic acid, styrenesulfonic acid, 3-sulfopropyl acrylate, 3-sulfopropyl methacrylate and acrylamidomethylpropanesulfonic acid and monomers containing phosphonic acid groups, such as, e.g., vinyl phosphate, allyl phosphate and acrylamidomethylpropanephosphonic acid; and esters, amides and anhydrides of these acids;

(d) N-vinyllactams such as, e.g., N-vinylpyrrolidone, N-vinyl-2-piperidone and N-vinylcaprolactam;

(e) vinyl acetal, vinyl butyral, vinyl alcohol and ethers and esters thereof (such as, e.g., vinyl acetate, vinyl propionate and methylvinylether), allyl alcohol and ethers and esters thereof, N-vinylimidazole, N-vinyl-2-methylimidazoline, and the hydroxystyrenes.

Corresponding polymers may also contain additional monomer units, for example, units derived from monomers without functional group, halogenated monomers, aromatic monomers etc. Non-limiting examples of such monomers include olefins such as, e.g., ethylene, propylene, the butenes, pentenes, hexenes, octenes, decenes and dodecenes, styrene, vinyl chloride, vinylidene chloride, tetrafluoroethylene, etc. Further, the polymers for use as organic protective agent in the process of the present invention are not limited to addition polymers, but also comprise other types of polymers, for example, condensation polymers such as, e.g., polyesters, polyamides, polyurethanes and polyethers, as well as polysaccharides such as, e.g., starch, cellulose and derivatives thereof, etc.

In some embodiments, polymers for use in the present invention include polymers which comprise monomer units of one or more unsubstituted or substituted N-vinyllactams, such as those having from about 4 to about 8 ring members (e.g., N-vinylcaprolactam, N-vinyl-2 piperidone and N-vinylpyrrolidone. These polymers include homo- and copolymers. In the case of copolymers (including, for example, random, block and graft copolymers), the N-vinyllactam (e.g., N-vinylpyrrolidone) units can be present in an amount of at least about 10 mole-%, e.g., at least about 30 mole-%, at least about 50 mole-%, at least about 70 mole-%, at least about 80 mole-%, or at least about 90 mole-%. By way of non-limiting example, the comonomers may comprise one or more of those mentioned in the preceding paragraphs, including monomers without functional group (e.g., ethylene, propylene, styrene, etc.), halogenated monomers, etc.

If the vinyllactam (e.g., vinylpyrrolidone) monomers (or at least a part thereof) carry one or more substituents on the heterocyclic ring, non-limiting examples of such substituents may include alkyl groups (for example, alkyl groups having from 1 to about 12 carbon atoms, e.g., from 1 to about 6 carbon atoms such as, e.g., methyl, ethyl, propyl and butyl), alkoxy groups (for example, alkoxy groups having from 1 to about 12 carbon atoms, e.g., from 1 to about 6 carbon atoms such as, e.g., methoxy, ethoxy, propoxy and butoxy), halogen atoms (e.g., F, Cl and Br), hydroxy, carboxy and amino groups (e.g., dialkylamino groups such as dimethylamino and diethylamino) and any combinations of these substituents.

Non-limiting specific examples of vinyllactam polymers for use in the present invention include homo- and copolymers of vinylpyrrolidone which are commercially available from, e.g., International Specialty Products (www.ispcorp.com). In particular, these polymers may include:

(a) vinylpyrrolidone homopolymers such as, e.g., grades K-15 and K-30 with K-value ranges of from 13-19 and 26-35, respectively, corresponding to average molecular weights (determined by GPC/MALLS) of about 10,000 and about 67,000;

(b) alkylated polyvinylpyrrolidones such as, e.g., those commercially available under the trade mark GANEX® which are vinylpyrrolidone-alpha-olefin copolymers that contain most of the alpha-olefin (e.g., about 80% and more) grafted onto the pyrrolidone ring, mainly in the 3-position thereof; the alpha-olefins may comprise those having from about 4 to about 30 carbon atoms; the alphaolefin content of these copolymers may, for example, be from about 10% to about 80% by weight;

(c) vinylpyrrolidone-vinylacetate copolymers such as, e.g., random copolymers produced by a free-radical polymerization of the monomers in a molar ratio of from about 70/30 to about 30/70 and having weight average molecular weights of from about 14,000 to about 58,000;

(d) vinylpyrrolidone-dimethylaminoethylmethacrylate copolymers;

(e) vinylpyrrolidone-methacrylamidopropyl trimethylammonium chloride copolymers such as, e.g., those commercially available under the trade mark GAFQUAT®;

(f) vinylpyrrolidone-vinylcaprolactam-dimethylaminoethylmethacrylate terpolymers such as, e.g., those commercially available under the trade mark GAFFIX®;

(g) vinylpyrrolidone-styrene copolymers such as, e.g., those commercially available under the trade mark POLECTRON®; a specific example thereof is a graft emulsion copolymer of about 70% vinylpyrrolidone and about 30% styrene polymerized in the presence of an anionic surfactant; or (h) vinylpyrrolidone-acrylic acid copolymers such as, e.g., those commercially available under the trade mark ACRYLIDONE® which are produced in the molecular weight range of from about 80,000 to about 250,000.

Accordingly, in some embodiments, those of skill in the art, using no more than knowledge available to the ordinary practitioner, the disclosure provided herein and routine experimentation, can select appropriate organic protective agents to preferentially produce silver nanowires as compared with other nanostructures.

Ratios of Silver Compound to Organic Protective Agent

One of skill in the art will appreciate that the literature discussing selective production of one form of nanostructure as compared to another has suggested that the ratio between the concentrations of the organic protective agent (i.e. the concentration of the 'OPA solution') to the concentration of the silver solution can affect the types of nanostructures formed (See: Sun et al., *Uniform Silver Nanowires Synthesis by Reducing AgNO3 with Ethylene Glycol in the Presence of Seeds and Poly(Vinyl Pyrrolidone)*, Chem, Mater. 14: 4736-4745 (2002) at page 4739, paragraph bridging col. 1 to col. 2).

Applicants have found that while generally maintaining these ratios that have been found to be suitable for silver nanowire formation, it is possible to increase the concentrations of these solutions, sometimes substantially. Thus, in some embodiments of this invention, the silver solution and/or OPA solution are prepared at concentrations that are significantly higher than those typically used. Moreover, the entire reaction can be run at significantly higher concentration such that the product solution is significantly more concentrated that has been previously disclosed. Thus, with reference to the product solution, in some embodiments, the ratio of the molar concentration of the organic protective agent to the molar concentration of the silver (either as an ion or as metal) is: in the range of about 10:1 to about 0.5:1. In some embodiments, the ratio of the molar concentration of the organic protective agent to the molar concentration of the silver (either as an ion or as metal) in the product solution is in the range of about 4:1 to about 0.75:1 or in the range of about 3:1 to about 1:1. Use of these higher concentrations conserves reagents and in general is more economically favorable, particularly for large scale production.

In some embodiments where a silver solution and an OPA solution is used, reference is made to the relative concentrations of these solutions. For example, in some embodiments the silver compound is added to the reaction as a silver solution comprising the silver compound in a silver solvent and the organic protective agent is added to the reaction as an OPA solution comprising the organic protective agent in an OPA solvent, wherein the ratio in the final reaction mix of the molar concentration of the organic protective agent in the OPA solvent to the molar concentration of the silver compound in the silver solvent is in the range of about 10:1 to 0.5:1.

In some embodiments, the polyol is used as a solvent to prepare the silver solution and the OPA solution. For example, the silver solvent could be a first portion of polyol and the OPA solvent a second portion of polyol. As discussed above, these solutions can be mixed as reactants with a third portion of polyol in a reaction vessel. The portion of polyol in the reaction vessel may be heated. In some embodiments, the first, second and third portions of polyol represent the entirety of the polyol.

Accordingly, in some embodiments, using no more than the disclosure provided herein and routine experimentation, those of skill in the art can select appropriate ratios of organic protective agent (or concentration for the OPA solution) to silver compound (or concentration for the silver solution) to preferentially produce silver nanowires as compared with other nanostructures.

Optional Reactants

The literature has suggested that chloride ion and iron are common contaminates of ethylene glycol and the presence of these contaminates may influence the nature of the nanostructures formed (See: Wiley et al., *Synthesis of Silver Nanostructures with Controlled Shapes and Properties, Acc. Chem. Res.*, 40: 1067-1076 (2007) at page 1068, col. 2). The iron contaminate may be in the form of Fe(II) and/or Fe(III).

Applicants have determined that other halide ions such as bromide ion can be a contaminate of a polyol or other solvent that might be used, for example, as the silver solvent or the OPA solvent. It has been determined that silver nanowires can be prepared when the concentration of halide ion in the product solution is in the range of about 50 μmolar to 1000 μmolar.

Similarly, it has been determined that silver nanowires can be formed when the concentration of Fe(II) and/or Fe(III) in the product solution is in the range of about 2 μmolar to about 150 μmolar.

Although the concentrations of halide ion and iron specified above are suitable for producing silver nanowires, it is to be understood that these ranges are not intended to be limiting as other concentrations of halide ion and/or iron may likewise be used.

It will be also understood that with respect to determining concentration, reference is made to the 'product solution' since the halide ion and/or iron may come from different sources. However, the product solution is formed from all the combined reactants and it is the concentration of halide ion and/or iron that is present in the reaction mixture that can affect the reaction. It is for this reason that concentrations of these compounds are expressed with reference to the product solution.

Because the halide ion and/or iron is often a contaminate of the polyol, a compound containing halide ion and/or iron (either as Fe(II) or Fe(III)) need not necessarily be added to the reaction as a reactant where a sufficient amount is introduced indirectly. However, if there is a deficiency, one may optionally combine at least one compound comprising halide ion and/or at least one compound comprising Fe(II) and/or Fe(III).

For this reason, it may be advisable to determine how much of these contaminates are present in the other reactants (e.g. the polyol) to be combined in the reaction prior to preparing the reactants for reaction. Many commercially available solvents and reagents come with a certificate of analysis which specifies amounts of iron and/or chloride ion as impurities. Based on this analysis a specified amount of at least one compound comprising halide ion and/or at least one compound comprising Fe(II) and/or Fe(III) can be added to adjust the concentrations to those specified above.

Moreover, where the concentration of halide ion and/or iron would exceed the concentrations specified above because of contaminates, one could select different batches of reactants/solvents to thereby avoid this situation.

When compound comprising the halide ion is to be used, it can be combined with the other reactants in various ways. For example, it can be mixed by adding it to (and thereby dissolving or suspending it in) the OPA solution. It can be mixed by adding it to (and thereby dissolving or suspending it in) the silver solution. It can be mixed by direct addition to the reaction vessel, which may contain polyol, or it can be mixed into the reaction (e.g. after all other reactants are added).

Similarly, when compound comprising the Fe(II) and/or Fe(III) is to be used, it can be combined with the other reactants in various ways. For example, it can be mixed by adding it to (and thereby dissolving or suspending it in) the OPA solution. It can be mixed by adding it to (and thereby dissolving or suspending it in) the silver solution. It can be mixed by direct addition to the reaction vessel, which may contain polyol, or it can be mixed into the reaction (e.g. after all other reactants are added).

Thus, in some embodiments, using no more than the disclosure provided herein and routine experimentation, one of skill in the art can determine when optional halide ion and/or iron (as Fe(II) and/or Fe(III)) is desired as well as an appropriate mode for mixing with the other reactants and then select the appropriate reactants to preferentially produce silver nanowires as compared with other nanostructures.

Supplemental Reducing Agents

In some embodiments it may be desirable to augment the reducing capacity of the polyol, for example, in order to reduce the required reaction time and/or the reaction temperature. The use of hydrogen as a supplemental reducing agent in the polyol process was suggested by Figlarz et al. (U.S. Pat. No. 4,539,041). Other non-limiting examples of reducing agents which may be employed in the polyol method include hydrazine and derivatives thereof, hydroxylamine and derivatives thereof, aldehydes such as, e.g., formaldehyde, hypophosphites, sulfites, tetrahydroborates (such as, e.g., the tetrahydroborates of Li, Na, K), LiAlH$_4$, polyhydroxybenzenes such as, e.g., hydroquinone, alkyl-substituted hydroquinones, catechols and pyrogallol; phenylenediamines and derivatives thereof; aminophenols and derivatives thereof; ascorbic acid and ascorbic acid ketals and other derivatives of ascorbic acid; 3-pyrazolidone and derivatives thereof; hydroxytetronic acid, hydroxytetronamide and derivatives thereof; bisnaphthols and derivatives thereof; sulfonamidophenols and derivatives thereof; and Li, Na and K metals (See: Published US Patent application No US 2007/0034052 A1 by Vanheusden et al.).

There are literature reports that poly(vinyl pyrrolidone) (PVP), which can be used as the organic protective agent, can be used as a reducing agent (See: Silvert et al., *J. Mater. Chem.*, 7(2): 293-299 (1997) at page 296). As discussed herein, PVP can be used as a organic protective agent as described herein. Consequently, in some embodiments, the organic protective agent can be also act as a supplemental reducing agent.

Thus, in some embodiments, using no more than the disclosure provided herein and routine experimentation, one of skill in the art can determine when supplemental reducing agents are desired and then select the appropriate supplemental reducing agent(s) to preferentially produce silver nanowires as compared with other nanostructures.

Reaction Conditions

The reaction conditions selected for the polyol process are those which preferentially produce the desired nanostructures, such as silver nanowires. Thus, according to various embodiments of this invention, reactants are selected, combined and then reacted under conditions that are selected to preferentially produce silver nanowires.

It has been suggested that reaction temperature can affect silver nanowire production. In particular, several reports suggest that temperature above and below 160° C. tend to inhibit nanowire formation (See: Sun et al., *Crystalline Silver Nanowires by Soft Solution Processing, Nano Letters*, 2(2): 165-168 (2002) at page 167, col. 2 and Sun et al., *Uniform Silver Nanowires Synthesis by Reducing AgNO3 with Ethylene Glycol in the Presence of Seeds and Poly (Vinyl Pyrrolidone), Chem, Mater.* 14: 4736-4745 (2002) at page 4742, col. 2). Contrary to this teaching, Applicants have found that temperatures in the range of 100° C. to 140° C. can be selected to produce reactions which preferentially comprise silver nanowires. Consequently, some embodiments of this invention pertain to selecting a reaction temperature at or below 145° C.

The literature has suggested that if nanocubes are desired, the initial concentration of silver in a silver solution should be selected to be higher than about 0.1M (100 mmolar) otherwise silver nanowires were the major product. (See: Sun et al., *Shape-Controlled Synthesis of Gold and Silver Nanoparticles, Science*, 298: 2176-2179 (2002) at page 2177, col. 1). In general, it was thought that the silver concentration had to be low in order for the kinetics to be favorable for silver nanowire formation. Contrary to this teaching, Applicants have found that significantly more concentrated silver solutions can be used in reactions that selectively generate silver nanowires over other shaped silver nanostructures. Moreover, the silver compound can be added in solid form to produce product solutions that contain large amounts of silver nanostructures. So in essence, there is no upper limit on the concentration of silver solutions or the amount of silver used in the reaction so long as the reaction can proceed under the selected condition (e.g. not so concentrated that the silver nanowire production is inhibited).

The literature has suggested that simultaneous addition of silver and PVP solutions is critical to the formation of silver products with wire-like morphologies (See: Sun et al., *Uniform Silver Nanowires Synthesis by Reducing $AgNO_3$ with Ethylene Glycol in the Presence of Seeds and Poly (Vinyl Pyrrolidone), Chem, Mater.* 14: 4736-4745 (2002) at page 4737, col. 2). Contrary to this teaching, Applicants have found that the silver and PVP solutions need not be simultaneously added. For example, Applicants have determined that when a silver solution and an OPA solution is selected for select production of silver nanowires, it is also possible to first add the silver solution and then the OPA solution or vice versa. It is also possible to mix the silver solution and the OPA solution and add this mixture to polyol which may be heated. Similarly, Applicants have determined that it is not necessary to use dropwise addition as one can add the reagents portionwise (e.g. pour one or more reagents into a mixture over a period of about 1 to 30 seconds) or use the reagents in solid form. Accordingly, it has been surprisingly determined by Applicants that these are not existing limitations.

Thus, it seems that the scientific literature is rife with inaccurate teachings and assumptions. Therefore, it is to be understood that reaction conditions for producing nanowires are not limited by prior teachings. Rather, using the disclosure provided herein and routine experimentation, one of skill in the art will be able to select appropriate reaction conditions to preferentially produce silver nanowires as compared with other nanostructures. Such conditions include, for example, selection of reactants, solvents (if any), reaction temperature, reaction time, whether or not some of the reactants will be combined as solutions or in solid form and if solutions, at what concentration and temperature they will be when combined. Such conditions may also, for example, include determining reaction scale, what order to add reactants, whether one or more of the reactants, if solutions, will be added dropwise or portionwise.

Reaction Temperature

The 'reaction temperature' is the temperature of the mixture once at least a portion of the polyol, the silver compound (or silver solution) and the organic protective agent (or OPA solution) have been combined (mixed). Numerous published methods for the polyol production of silver nanowires employ a reaction temperature of 160° C. (See for example: Sun et al., *Nano Letters*, 2(2): 165-168 (2002) at the Abstract and endnote 15; Reyes-Gasga et al., *Journal of Crystal Growth*, 283: 162-172 at page 163; Sun et al., *Advanced Materials*, 14(11): 833-837 (2002) at page 836; Sun et al., *Chem, Mater.*, 14: 4736-4745 (2002) at Abstract and page 4737, col. 2; Wiley et al., *Chem. Eur. J.*, 11: 454-463 (2005) at page 456-457, bridging paragraph; Wiley et al. *Acc. Chem. Res.*, 40: 1067-1076 (2007) at page 1068, col. 2.) In other published reports the temperature of the reaction was 148° C. (See for example: Wiley et al., *Langmuir*, 21(18): 8077-8080 (2005) at page 8078, col. 2; and Wiley et al. *Nano Letters*, 4(9): 1733-1739 (2004) at the Abstract). In fact, certain reports suggest that the temperature of about 160° C. for the polyol reaction is critical for the production of silver nanowires as compared with other silver nanostructures (See for example: Sun et al., *Science*, 298: 2176-2179 (2002) at page 2177, col. 1; Sun et al., *Nano Letters*, 2(2): 165-168 (2002) at page 167, col. 2, last paragraph; and Sun et al., *Chem, Mater.*, 14: 4736-4745 (2002) at page 4742-4743, bridging paragraph). That is, these articles suggest that a reaction temperature that is significantly higher or lower than 160° C. favors the production of other nanostructures as compared with silver nanowires.

Surprisingly, Applicants have found that the polyol reaction operated at a reaction temperature significantly below 160° C. can still produce product solutions comprising a greater weight percent of nanowires as compared with the weight percent of all other nanostructures. For example, the reaction temperature can be less than or equal to 145° C. The reaction temperature can be (but is not necessarily) above ambient (room) temperature. In some embodiments, the reaction temperature is maintained from between 60° C. to 145° C. during the reaction. In some embodiments, the reaction temperature is maintained from between about 80° C. to about 135° C. In some embodiments, the reaction temperature is maintained from between about 100° C. to about 130° C. In some embodiments, the reaction temperature is maintained from between about 120° C. to about 140° C. In some embodiments, the reaction temperature is maintained from between about 100° C. to about 145° C. In some embodiments, the reaction temperature is maintained from between about 110° C. to about 140° C. In some embodiments, the reaction temperature is maintained from between about 125° C. to about 145° C. In some embodiments, the reaction temperature is maintained from between about 130° C. to about 140° C. In some embodiments, the reaction temperature is maintained from between about 120° C. to about 130° C. In some embodiments, the reaction temperature is maintained from between about 120° C. to about 135° C.

In some embodiments, such as when an acid compound is used or when the silver compound is combined in solid form (rather than as a component of the silver solution), the reaction temperature can be above 145° C. This is not a limitation since the temperature can be below 145° C. when an acid compound is present. For example, the reaction temperature can be maintained in the range from about 100° C. to about 200° C. In some embodiments, the reaction temperature is maintained from between about 125° C. to about 185° C. In some embodiments, the reaction temperature is maintained from between about 130° C. to about 170° C. In some embodiments, the reaction temperature is maintained from between about 150° C. to about 170° C. In some embodiments, the reaction temperature is maintained from between about 80° C. to about 135° C. In some embodiments, the reaction temperature is maintained from between about 100° C. to about 130° C. In some embodiments, the reaction temperature is maintained from between about 120° C. to about 140° C. In some embodiments, the reaction temperature is maintained from between about 100° C. to about 145° C. In some embodiments, the reaction temperature is maintained from between about 110° C. to about 140° C. In some embodiments, the reaction temperature is maintained from between about 125° C. to about 145° C. In some embodiments, the reaction temperature is maintained from between about 130° C. to about 140° C. In some embodiments, the reaction temperature is maintained from between about 120° C. to about 130° C.

The reaction temperature of the reaction mixture is, at least in part, determined by factors such as the heat source used to heat the reaction, the surface area of the reaction vessel that contacts the heat source, the boiling point of the solvent(s) included therein (e.g., the boiling point of at least the polyol), the thermal stability of the organic protective agent, the reactivity of the silver compound and the polyol, and the temperature, volume and rate of addition of the silver solution when combined with the other reactants as well as the temperature of the other reactants when the silver solution is combined therewith. For example, if an OPA solution is used, the reaction temperature can be affected by its temperature, volume and rate of addition.

Thus, in some embodiments, using no more than the disclosure provided herein and routine experimentation, one of skill in the art can select an appropriate reaction temperature to preferentially produce silver nanowires as compared with other nanostructures.

Reaction Time

The reaction time is measured from the time that at least a portion of each of the reactants to be reacted are combined (i.e. there must be a mixture that contains at least a portion of each of the reactants that are to be reacted) and then extends through any time where a continued combining of the reactants occurs until the time when all reactants have been added to the reaction. The reaction time also includes the time after all of the reactants have been combined during which nanostructures are produced. The reaction time also includes the time after nanostructures are produced, the reaction is cooled, and until the process of separating the metal from the other components of the product solution (e.g. by decanting, filtration, precipitation, or centrifugation) is completed.

There is no limitation on the reaction time. It can be as short as 1-2 minutes (or shorter) or as long as a week (or longer). In general the reaction is complete when the silver metal has formed nanostructures. Although in some cases the reaction can be permitted to continue so that processes, such as Ostwald Ripening (See: Silvert et al., Preparation of colloidal silver dispersions by the polyol process, Part 2—Mechanism of particle formation; *J. Mater. Chem.* 7(2): 293-299 (1997) at the abstract and FIG. 14), can occur, this is not essential.

In practice, reaction times can be from about 15 minutes to about 24 hours. In some embodiments, reaction times can be from about 30 minutes to about 5 hours. In some embodiments, reaction times can be from about 1 to about 4 hours. In some embodiments, reaction times can be from about 15 minutes to about 1 hour. In some embodiments, reaction times can be from about 30 minutes to about 45 minutes. It is to be understood that these time frames are not limiting as the reactions time can also be extremely short or extremely long. The only limitation is that the reaction produces the desired nanostructure, such as silver nanowires. In some embodiments, the reaction time can be from about 2 minutes to several weeks, months or even years.

Thus, in some embodiments, using no more than the disclosure provided herein and routine experimentation, one of skill in the art can select an appropriate reaction time to preferentially produce silver nanowires as compared with other nanostructures.

Mixing/Combining Reactants

According to embodiments of the invention, the reactants are combined (mixed) and reacted to thereby produce nanostructures, including nanowires. The reactants can be combined as solutions or in solid form. The order of addition of the reactants is not limiting as they can generally be combined in numerous ways. For example, the silver compound can be mixed as a silver solution comprising the silver compound in a first portion of the polyol and the organic protective agent can mixed as an OPA solution comprising the organic protective agent in a second portion of the polyol. The silver solution and the OPA solution can, in some embodiments, be simultaneously added to the polyol (or a portion (i.e. a third portion) of the polyol). This addition can be dropwise or portionwise. In some embodiments, the first, second and third portions of polyol represent the entirety of the polyol used in the reaction.

Portionwise addition is generally accomplished by pouring the reactant into another reactant or mixture with which it is being mixed over a short period of from about 1 to about 30 seconds. The period may be longer than 30 seconds and the exact time for pouring will depend on the volume to be added. Moreover, the portions may be the entirety of the reactant or may represent a portion, whereby the reactant is mixed in two or more portions which are combined serially or sequentially.

In some embodiments, the silver solution can be mixed with the polyol (e.g. a third portion of the polyol) before the OPA solution is mixed. In some embodiments, the OPA solution can be mixed with the polyol (e.g. a third portion of the polyol) before the silver solution is mixed. In some embodiments, part of one of either the OPA solution or silver solution can be added, then part of the other of the OPA solution or silver solution can be added, or vice versa. This process can then be repeated on a second part, third part, etc. until the entirety of each solution has been mixed with the polyol (e.g. a third portion of the polyol).

In some embodiments, the silver solution and the OPA solution can be mixed together and then this mixture can be added to the polyol (or portion of the polyol). In some embodiments, the polyol may be added to the OPA solution and/or the silver solution.

As discussed above, the silver compound and/or organic protective agent can be mixed in solid form. This addition can be continuous over a period of time or portionwise. Similar to the discussion pertaining to solutions, the order of addition of the solids is not limiting as the reactants can be combined in any way that produces the desired nanostructures, such as silver nanowires.

According to some embodiments of this invention, an acid compound can be used as a reactant. As with the other reactants, there is no firm limitation on the order of mixing so long as the reaction produces the desired nanostructure, such as silver nanowires. The acid compound can be a liquid, solid or gas. If a liquid, it can be mixed directly in solution either dropwise or portionwise. If a solid, the acid compound can be mixed in solid form or in solution either dropwise or portionwise. If a gas, it can be bubbled into (through) the reaction.

Thus, in some embodiments, using no more than the disclosure provided herein and routine experimentation, one of skill in the art can select appropriate forms of the reactants and order of their addition to preferentially produce silver nanowires as compared with other nanostructures.

5. Various Embodiments of the Invention

It should be understood that the order of steps or order for performing certain actions (e.g. the addition of reactants) is immaterial so long as the present teachings remain operable or unless otherwise specified. Moreover, in some embodiments, two or more steps or actions can be conducted simultaneously so long as the present teachings remain operable or unless otherwise specified.

In some embodiments, this invention pertains to a method for the production of silver nanowires. Said method comprises reacting at least one polyol, at least one silver compound capable of producing silver metal when reduced and at least one organic protective agent (OPA). As described supra, optionally at least one compound comprising halide ion and/or at least one compound comprising Fe(II) and/or Fe(III) can be combined, for example, where a residual amount of halide ion and/or iron in other reactants is not present in a desired amount. Said combined reactants are reacted at a reaction temperature and under conditions that produce a product solution comprising at least 10 weight percent (10 wgt %) silver nanowires as compared with a weight percent of all other silver nanostructures in the product solution wherein: a) the reaction temperature is less than or equal to 145° C.; and/or wherein a ratio of total moles of silver (either as an ion or as metal) to a total volume of polyol or polyols (in liters) in the product solution is greater than or equal to 0.1 molar; and b) wherein a ratio of a molar concentration of the organic protective agent to a molar concentration of the silver (either as an ion or as metal) in the product solution is less than or equal to 10:1.

In some embodiments of the above described method, the aspect ratio of the at least 10 weight percent silver nanowires can be at least 150, at least 200, at least 250, at least 300, at least 500, at least 750, at least 1000, at least 1500, at least 2000, or at least 3000.

In some embodiments of the above described method, the weight percent of silver nanowires, as compared with all other nanostructures in the product solution, is at least 15 weight percent (15 wgt %). In some embodiments, the weight percent of silver nanowires, as compared with all other nanostructures in the product solution, is at least 20 weight percent (20 wgt %). In some embodiments, the weight percent of silver nanowires, as compared with all other nanostructures in the product solution, is at least 25 weight percent (25 wgt %). In some embodiments, the weight percent of silver nanowires, as compared with all other nanostructures in the product solution, is at least 30 weight percent (30 wgt %). In some embodiments, the weight percent of silver nanowires, as compared with all other nanostructures in the product solution, is at least 40 weight percent (40 wgt %). In some embodiments, the weight percent of silver nanowires, as compared with all other nanostructures in the product solution, is at least 50 weight percent (50 wgt %). In some embodiments, the weight percent of silver nanowires, as compared with all other nanostructures in the product solution, is at least 60 weight percent (60 wgt %). In some embodiments, the weight percent of silver nanowires, as compared with all other nanostructures in the product solution, is at least 80 weight percent (80 wgt %). In some embodiments, the weight percent of silver nanowires, as compared with all other nanostructures in the product solution, is at least 90 weight percent (90 wgt %).

According to the above described method, the reaction can be conducted under conditions that selectively produce silver nanowires. Applicants have described numerous conditions that preferentially produce silver nanowires over other nanostructures. As noted supra, Applicants observations have defied conventional wisdom regarding conditions that preferentially produce silver nanowires. Using no more than the guidance provided herein and routine experimentation, one of skill in the art will be able to select conditions that produce silver nanowires, including conditions that preferentially produce bulk product of uniform silver nanowires having aspect ratios of at least 150.

The reactants which are reacted can be combined (e.g. mixed) prior to and/or during the reaction. Various methodologies for combining/mixing the reactants have been described supra. Thus, in some embodiments, this invention pertains to a method for the production of silver nanowires comprising: i) mixing as reactants for a reaction: a) at least one silver compound capable of producing silver metal when reduced; b) at least one polyol; c) at least one organic protective agent; and d) optionally at least one compound comprising halide ion and/or at least one compound comprising Fe(II) and/or Fe(III). The mixture is then reacted at a reaction temperature and under conditions that produce a product solution comprising at least 10 weight percent (10 wgt %) silver nanowires as compared with a weight percent of all other silver nanostructures in the product solution; a) wherein the reaction temperature is less than or equal to 145° C.; and/or wherein a ratio of total moles of silver (either as an ion or as metal) to a total volume of polyol or polyols (in liters) in the product solution is greater than or equal to 0.1 molar; and b) wherein a ratio of a molar concentration of the organic protective agent to a molar concentration of the silver (either as an ion or as metal) in the product solution is less than or equal to 10:1.

One of skill in the art will appreciate that the reaction can begin when at least a portion of all of the different reactants has been mixed (combined) and then continue while the remainder of the reactants are mixed and thereafter for a period of time (i.e. the reaction time). Thus, the description set forth above is not intended to be limited to situations where the reaction is not initiated until the entirety of each reactant has been mixed.

Applicants have surprisingly discovered that the addition of an acid compound (that is not the silver compound) can improve the yield of nanowires as compared with other nanostructures with or without reducing the reaction temperature and/or with or without also increasing the concentration of silver compound used in the reaction. It is also believed that silver nanowires can be produced under conditions without regard to the ratio of the molar concentration of the organic protective agent to the molar concentration of the silver (either as an ion or as metal) in the product solution. Similarly, it is believed that there is no limitation of the concentration of silver in the product solution when an acid compound is added. These observations are in some ways contrary to the observations of Xia et al. who used nitric acid to select for production of nanocubes (See: US Published Patent Application No. US 2008/0003130 A1 to Xia et al. published on Jan. 3, 2008 at paragraph 0048).

Thus, in some embodiments, this invention pertains to a method for the production of silver nanowires comprising reacting: i) at least one polyol; ii) at least one silver compound capable of producing silver metal when reduced; iii) at least one organic protective agent (OPA); iv) at least one acid compound; v) optionally at least one compound comprising halide ion; and vi) optionally at least one compound comprising Fe(II) and/or Fe(III); at a reaction temperature and under conditions that produce silver nanowires. Non-limiting examples of acid compounds include nitric acid, acetic acid, hydrochloric acid or combinations comprising at least two of the forgoing.

Using no more than the guidance provided herein, the knowledge available to the ordinary practitioner and routine experimentation, one of skill in the art will be able to select conditions that produce silver nanowires, including conditions that preferentially produce uniform silver nanowires having aspect ratios of at least 150. For example, in some embodiments, the reaction produces a product solution comprising at least 10 weight percent (10 wgt %) silver nanowires as compared with a weight percent of all other silver nanostructures in the product solution.

The reactants which are reacted can be combined (e.g. mixed) prior to and/or during the reaction. Various methodologies for combining/mixing the reactants have been described supra. One of skill in the art will appreciate that the reaction can begin when at least a portion of all of the different reactants has been mixed (combined) and then continue while the remainder of the reactants are mixed and thereafter for a period of time (i.e. the reaction time). Thus, the description set forth above is not intended to be limited to situations where the reaction is not initiated until the entirety of each reactant has been mixed.

From the time that organic protective agents began to be used, it seems that the polyol process has always been practiced with solutions of silver compound (i.e. the 'silver solution') and/or solutions of the organic protective agent (the "OPA solution"). Applicants have surprisingly observed that silver nanostructures (and in particular, silver nanowires; including silver nanowires of high aspect ratio) can be prepared when the silver compound and/or OPA solution is mixed (combined) with the other reactants in solid form rather than as a solution. For example, the silver compound can be added in solid form (rather than as a silver solution) directly to a mixture of all the other reactants (to thereby for the reaction mixture) or to a mixture of two or more of the other reactants (e.g. the polyol and the organic protective agent). Similarly, the polyol process has been practiced using solutions comprising the organic protective agent, but Applicants have observed that the organic protective agent also can be added to other reactants in solid form (rather than as a solution) to produce silver nanowires.

Consequently, in some embodiments, this invention pertains to a method for the production of silver nanowires comprising reacting (as reactants in a reaction): i) at least one polyol; ii) at least one silver compound capable of producing silver metal when reduced wherein the silver compound is in solid form when combined with the other reactants; iii) at least one organic protective agent (OPA); iv) optionally at least one compound comprising halide ion; and vi) optionally at least one compound comprising Fe(II) and/or Fe(III). The combined reactants are reacted at a reaction temperature and under conditions that produce silver nanowires, wherein the silver compound is mixed with other reactants (i.e. added to other reactants) in solid form rather than as a silver solution. For example, solid silver compound can, in some embodiments, be added as the last reactant of a reaction mixture and the reaction can produce silver nanowires.

Thus, using no more than the guidance provided herein and routine experimentation, one of skill in the art will be able to select conditions that produce silver nanowires, including conditions that preferentially produce uniform silver nanowires having aspect ratios of at least 150. For example, in some embodiments, the reaction produces a product solution comprising at least 10 weight percent (10 wgt %) silver nanowires as compared with a weight percent of all other silver nanostructures in the product solution.

Still in some embodiments, this invention pertains to a method for the production of silver nanowires. Said method comprises reacting at least one polyol, at least one silver compound capable of producing silver metal when reduced and at least one organic protective agent (OPA). As described supra, optionally at least one compound comprising halide ion and/or at least one compound comprising Fe(II) and/or Fe(III) can be combined, for example, where the residual amount of halide ion and/or iron in other reactants is not present in a desired amount. Said combined reactants are reacted at a reaction temperature and under conditions that produce a product solution comprising at least 10 weight percent (10 wgt %) silver nanowires as compared with a weight percent of all other silver nanostructures in the product solution wherein the reaction produces bulk silver nanowire product having a length weighted average of at least 10 μm. In some embodiments, the reaction temperature is less than or equal to 145° C. and/or a ratio of total moles of silver (either as an ion or as metal) to a total volume of polyol or polyols (in liters) in the product solution is greater than or equal to 0.05 molar. In some embodiments, a ratio of a molar concentration of the organic protective agent to a molar concentration of the silver (either as an ion or as metal) in the product solution is less than or equal to 10:1.

In yet some other embodiments, this invention pertains to a method for the production of silver nanowires. Said method comprises reacting at least one polyol, at least one silver compound capable of producing silver metal when reduced and at least one organic protective agent (OPA). As described supra, optionally at least one compound comprising halide ion and/or at least one compound comprising Fe(II) and/or Fe(III) can be combined, for example, where the residual amount of halide ion and/or iron in other reactants is not present in a desired amount. Said combined reactants are reacted at a reaction temperature and under conditions that produce a product solution comprising at least 10 weight percent (10 wgt %) silver nanowires as compared with a weight percent of all other silver nanostructures in the product solution wherein the reaction produces bulk silver nanowire product having an AR weighted average that is at least 125. In some embodiments, the reaction temperature is less than or equal to 145° C. and/or a ratio of total moles of silver (either as an ion or as metal) to a total volume of polyol or polyols (in liters) in the product solution is greater than or equal to 0.05 molar. In some embodiments, a ratio of a molar concentration of the organic protective agent to a molar concentration of the silver (either as an ion or as metal) in the product solution is less than or equal to 10:1.

In still some other embodiments, this invention pertains to a method for the production of silver nanowires comprising: i) mixing as reactants for a reaction: a) at least one silver compound capable of producing silver metal when reduced; b) at least one polyol; c) at least one organic protective agent; and d) optionally at least one compound comprising halide ion and/or at least one compound comprising Fe(II) and/or Fe(III). The mixture is then reacted at a reaction temperature and under conditions that produce a product solution comprising at least 10 weight percent (10 wgt %) silver nanowires as compared with a weight percent of all other silver nanostructures in the product solution wherein the reaction produces bulk silver nanowire product having a length weighted average of at least 10 µm. In some embodiments, the reaction temperature is less than or equal to 145° C. and/or a ratio of total moles of silver (either as an ion or as metal) to a total volume of polyol or polyols (in liters) in the product solution is greater than or equal to 0.05 molar. In some embodiments, a ratio of a molar concentration of the organic protective agent to a molar concentration of the silver (either as an ion or as metal) in the product solution is less than or equal to 10:1.

In still some other embodiments, this invention pertains to a method for the production of silver nanowires comprising: i) mixing as reactants for a reaction: a) at least one silver compound capable of producing silver metal when reduced; b) at least one polyol; c) at least one organic protective agent; and d) optionally at least one compound comprising halide ion and/or at least one compound comprising Fe(II) and/or Fe(III). The mixture is then reacted at a reaction temperature and under conditions that produce a product solution comprising at least 10 weight percent (10 wgt %) silver nanowires as compared with a weight percent of all other silver nanostructures in the product solution wherein the reaction produces bulk silver nanowire product having an AR weighted average that is at least 125. In some embodiments, the reaction temperature is less than or equal to 145° C. and/or a ratio of total moles of silver (either as an ion or as metal) to a total volume of polyol or polyols (in liters) in the product solution is greater than or equal to 0.05 molar. In some embodiments, a ratio of a molar concentration of the organic protective agent to a molar concentration of the silver (either as an ion or as metal) in the product solution is less than or equal to 10:1.

The reactants which are reacted can be combined (e.g. mixed) prior to and/or during the reaction. Various methodologies for combining/mixing the reactants have been described supra. One of skill in the art will appreciate that the reaction can begin when at least a portion of all of the different reactants has been mixed (combined) and then continue while the remainder of the reactants are mixed and thereafter for a period of time (i.e. the reaction time). Thus, the description set forth above is not intended to be limited to situations where the reaction is not initiated until the entirety of each reactant has been mixed.

6. Examples

Aspects of the present teachings can be further understood in light of the following examples, which should not be construed as limiting the scope of the present teachings in any way.

Example 1

This example uses the solution phase approach for the production of silver nanowires. A silver nanowire yield of greater than 60 weight percent** of all of the nanostructures produced is typically observed for this type of example.

** For Examples 1-9, yield is determined based on the weight (mass) of the bulk product compared with the theoretical yield (in weight or mass, as appropriate) of silver metal.

The reaction temperature was approximately 130° C. The following chemicals were used in this reaction:

Purified Ethylene Glycol ('EG', City Chemical, LN 50A82)
Silver Nitrate ('AgNO$_3$', Aldrich)
Poly (vinyl pyrrolidone) ('PVP', 55,000 MW)
NaCl (Aldrich)
Silicone Fluid SF96/50 (Thomas Scientific, for making up the oil bath)
Isopropanol (isopropyl alcohol) ('IPA' Pharmco)

The following solutions were prepared using said chemicals:

100 mM NaCl in EG (the 'NaCl Solution')
20 g AgNO$_3$ in 100 mL EG (the 'AgNO$_3$ Solution'—made up to be homogeneous at least 30 min before adding to the reaction)
60 g PVP in 650 mL EG (the 'PVP Solution')

Procedure:

To a 1000 mL round bottom flask, was added the PVP Solution and 2.8 mL of the NaCl Solution (373 µM final concentration). The mixture was then heated to 130° C. (with the probe inserted in oil bath) in silicone oil bath with vigorous stirring until the temperature had stabilized for 30 minutes. At this time, the AgNO$_3$ Solution was added to the mixture dropwise by syringe pump using a rate anywhere between 300 mL/hr to 900 mL/hr while the mixture was stirred vigorously.

After addition, the reaction mixture was heated to 130° C. under vigorous stirring from 1 hour up to 3 hours, during which time a high yield of nanowires with average length of approximately 25-30 µm were formed.

The oil bath was removed and the reaction permitted to cool to room temperature. The reaction mixture was poured into 2500 mL of isopropyl alcohol and the solids were permitted to settle. The settled product was then separated by decanting the supernatant, and then resuspended in 2000 mL of isopropyl alcohol or deionized (DI) water with stirring to wash away the excess attached PVP from the silver nanowires before another settling process (when no stirring was used). This wash-settle process was repeated four times and then the silver nanowires were resuspended in the desired volume of isopropanol. In general, the 'desired volume' is selected based on the intended storage concentration, or the end use of the material. Final concentrations of suspensions can be from 1 mg/mL to >40 mg/mL (even up to a wet paste concentration).

Figure 4:
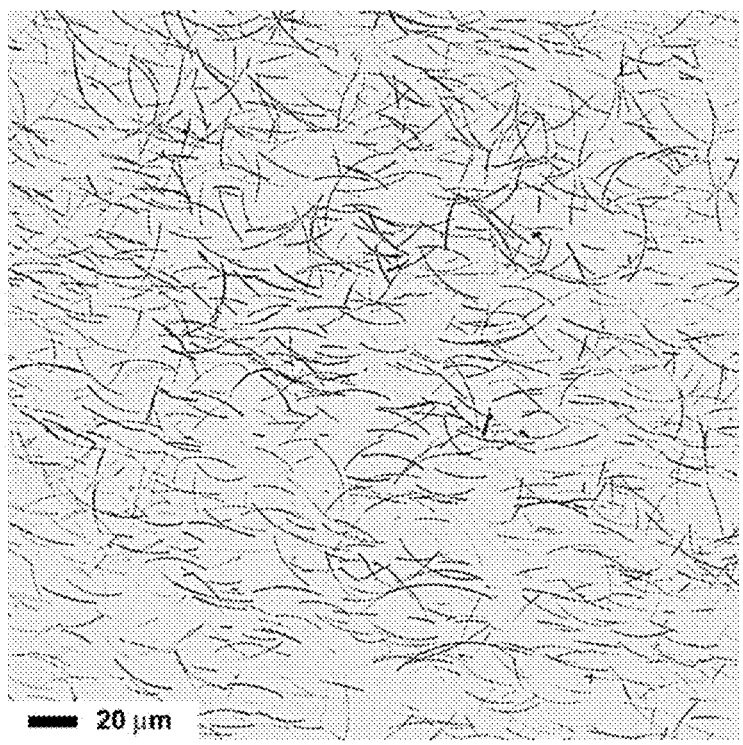
FIG. 4 is a microscope image of a representative nanowire preparation.

FIG. 4 is the optical microscope image of silver nanowire product produced by a reaction performed according to this protocol.

Example 2

This example uses the solution phase approach for the production of silver nanowires. A silver nanowire yield of greater than 60 weight percent** of all of the nanostructures produced is typically observed for this type of example.

The reaction temperature was approximately 130° C.-140° C. The following chemicals were used in this reaction:
Anhydrous Ethylene Glycol ('EG')
Silver Nitrate ('AgNO$_3$', Aldrich)
Poly(vinyl pyrrolidone) ('PVP', 55,000 MW)
Iron (II) Acetylacetonate (Aldrich)
NaCl (Aldrich)
Silicone Fluid SF96/50 (Thomas Scientific, for making up the oil bath)
Reagent Alcohol—200 proof (Pharmco)
Isopropanol (Pharmco)

The following solutions were prepared using said chemicals:
100 mM NaCl in EG (the 'NaCl Solution')
2.2 mM Fe$^{2+}$(AcAc)$_2$ in EG (the 'Fe(II) Solution')
25 g AgNO$_3$ in 100 mL EG (the 'AgNO$_3$ Solution'—made up to be homogeneous at least 30 min before adding to the reaction)
25 g PVP in 300 mL EG (the 'PVP Solution') containing 1125 µL NaCl
Solution (=75 µM final amount added) and 15 mL Fe(II) Solution (=22 µM final amount added). The solution of PVP in EG was stirred overnight, but the NaCl Solution and Fe(II) Solution were added 5 minutes prior to adding the PVP solution to the reaction mix.

Procedure:
To a 2000 mL round bottom flask, was added 1100 mL of EG and this was heated to 130° C.-140° C. using an oil bath and vigorous stirring until the temperature had stabilized for about 30 minutes. The PVP Solution and AgNO$_3$ Solution were then each added (separately but simultaneously) using a syringe pump, with vigorous stirring, at a rate of 240 mL/hour to the EG. The total time of addition was approximately 25 minutes.

After addition of the solutions was complete, the reaction mixture was heated to 140° C. under vigorous stirring until the nanowires with a weighted average length of 25-30 µm were formed but still thin. The nanowire length and diameters was determined by optical microscopy and transmission electron microscopy (TEM), respectively.

The oil bath was then removed and the reaction cooled immediately by adding the reaction mixture to 1-liter ice-cold isopropanol (IPA). Solids were permitted to settle. The settled product was then separated by decanting the supernatant, and resuspended in 2000 mL of isopropyl alcohol or DI water with stirring to remove excess attached PVP from the silver nanowires before another settling process (when no stirring was used). This wash-settle process was repeated four times and then the silver nanowires were resuspended in the desired volume of isopropanol.

Figure 5:
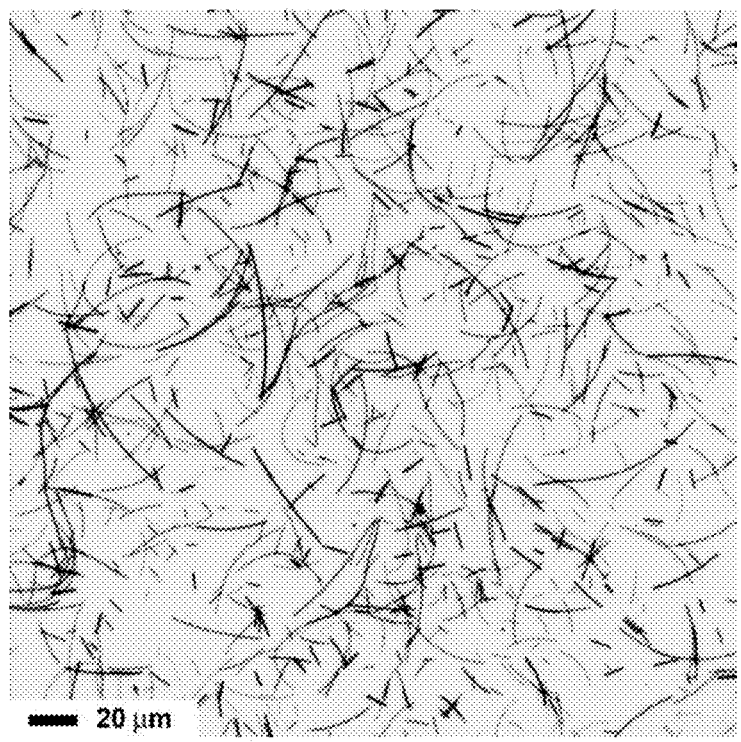
FIG. 5 is a microscope image of a representative nanowire preparation.

FIG. 5 is the microscope image of silver nanowire product produced by a reaction performed according to this protocol.

Example 3

This example uses the solution phase approach for the production of silver nanowires. A silver nanowire yield of greater than 60 weight percent** of all of the nanostructures produced is typically observed for this type of example.

The reaction temperature was approximately 130° C. The following chemicals were used in this reaction:
Anhydrous Ethylene Glycol ('EG', Labchem E29601)
Silver Nitrate ('AgNO$_3$', Aldrich)
Poly (vinyl pyrrolidone) ('PVP', Aldrich, 55,000 MW)
Iron (II) Acetylacetonate (Aldrich)
NaCl (Aldrich)
Silicone Fluid SF96/50 (Thomas Scientific, for making up the oil bath)
Isopropanol (Pharmco)

The following solutions were prepared using said chemicals:
100 mM NaCl in EG (the 'NaCl Solution')
2.2 mM Fe$^{2+}$(AcAc)$_2$ in EG (the 'Fe(II) Solution')
20 g AgNO$_3$ in 100 mL EG (the 'AgNO$_3$ Solution'—made up to be homogeneous at least 30 min before adding to the reaction)

Procedure:
To a 1000 mL round bottom flask, was added the 60 g PVP powder and 750 mL EG. The mixture was then heated to 130° C. (with the probe inserted in oil bath) in silicone oil bath with vigorous stirring until all the PVP powder had been dissolved and the temperature had stabilized for 30 minutes. 3.75 mL of the NaCl Solution (441 µM final concentration) and 2.5 mL Fe(II) Solution (=6.5 µM final amount added) was then added. After 5 minutes, the AgNO$_3$ Solution was added to the mixture dropwise by syringe pump at a rate anywhere between 300 mL/hr to 900 mL/hr while the mixture was stirred vigorously.

After addition, the reaction mixture was heated to 130° C. under vigorous stirring for approximately 0.5 hour to 1 hour, at which time a high yield of nanowires with average length of approximately 25-30 µm.

The oil bath was removed and the reaction permitted to cool to room temperature. Then the reaction mixture was poured into 2500 mL of isopropyl alcohol and the solids were permitted to settle. The settled product was then separated by decanting the supernatant, and then resuspended in 2000 mL of isopropyl alcohol or DI water with stirring to wash the excess attached PVP from the silver nanowires before another settling process (when no stirring was used). This wash-settle process was repeated four times and then the silver nanowires were resuspended in the desired volume of isopropanol.

Figure 6:
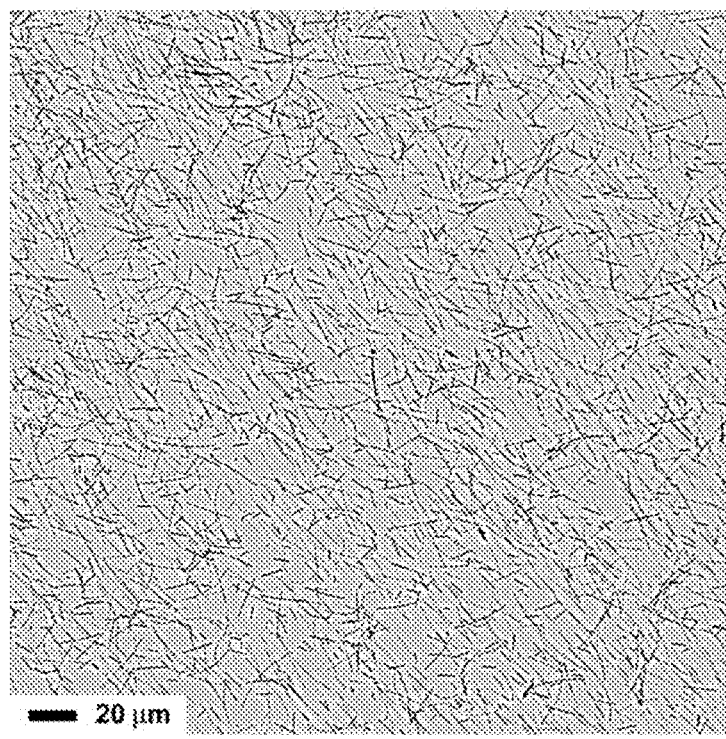
FIG. 6 is a microscope image of a representative nanowire preparation.

FIG. 6 is the microscope image of silver nanowire product produced by a reaction performed according to this protocol.

Example 4

This example uses the solution phase approach for the production of silver nanowires. A silver nanowire yield of greater than 50 weight percent** of all of the nanostructures produced is typically observed for this type of example.

The reaction temperature was approximately 130° C. The following chemicals were used in this reaction:
Anhydrous Ethylene Glycol ('EG', Labchem)
Silver Nitrate ('AgNO$_3$', Aldrich)
Poly (vinyl pyrrolidone) ('PVP', Aldrich, 55,000 MW)
Iron (II) Acetylacetonate (Aldrich)
NaCl (Aldrich)
Silicone Fluid SF96/50 (Thomas Scientific, for making up the oil bath)
Isopropanol (Pharmco)

The following solutions were prepared using said chemicals:

100 mM NaCl in EG (the 'NaCl Solution')
2.2 mM $Fe^{2+}(AcAc)_2$ in EG (the 'Fe(II) Solution')
20 g $AgNO_3$ in 100 mL EG (the '$AgNO_3$ Solution'—made up to be homogeneous at least 30 min before adding to the reaction)

Procedure:

To a 1000 mL round bottom flask, was added the 48 g PVP powder and 500 mL EG. The mixture was then heated to 130° C. (with the probe inserted in oil bath) in silicone oil bath with vigorous stirring until all the PVP powder had been dissolved and the temperature had stabilized for 30 minutes. 3 mL of the NaCl Solution (483 µM final concentration) and 20 mL Fe(II) Solution (=71 µM final amount) was then added. After 5 minutes, the $AgNO_3$ Solution was poured (in less than about 5 seconds) directly into the mixture while the mixture was stirred vigorously.

After addition, the reaction mixture was heated to 130° C. under vigorous stirring for approximately 0.5 hour to 1.5 hours, at which time nanowires with average length of 25-30 µm approximately were formed.

The oil bath was removed and the reaction permitted to cool to room temperature. Then the reaction mixture was poured into 2500 mL of isopropyl alcohol and the solids were permitted to settle. The settled product was then separated by decanting the supernatant, and then resuspended in 2000 mL of isopropyl alcohol or DI water with stirring to wash off excess attached PVP from the silver nanowires before another settling process (when no stirring was used). This wash-settle process was repeated four times and then the silver nanowires were resuspended in the desired volume of isopropanol.

Figure 7:
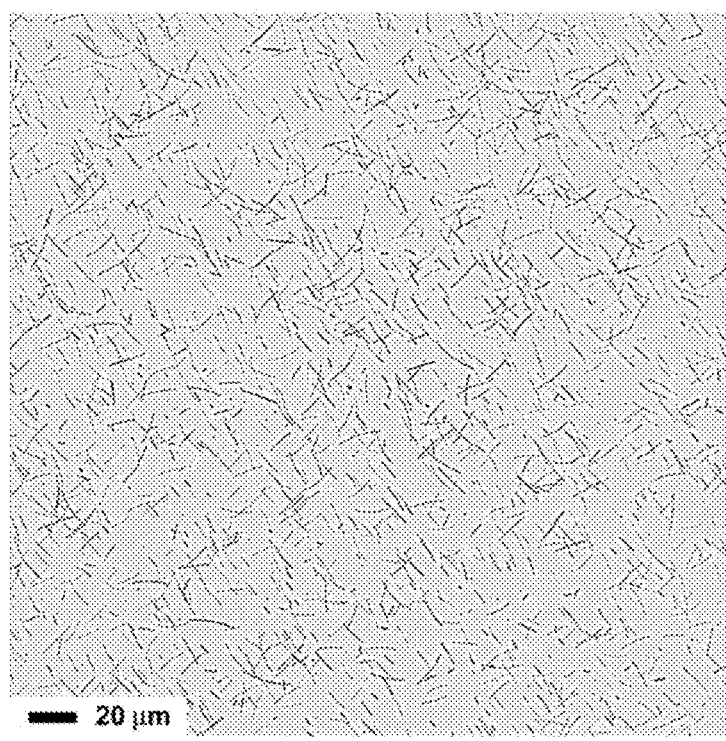
FIG. 7 is a microscope image of a representative nanowire preparation.

FIG. 7 is the microscope image of silver nanowire product produced by a reaction performed according to this protocol.

Example 5

This example uses the solution phase approach for the production of silver nanowires. A silver nanowire yield of greater than 50 weight percent** of all of the nanostructures produced is typically observed for this type of example.

The reaction temperature was approximately 130° C. The following chemicals were used in this reaction:
Anhydrous Ethylene Glycol ('EG')
Silver Nitrate ('$AgNO_3$', Aldrich)
Poly (vinyl pyrrolidone) ('PVP', 55,000 MW)
Iron (II) Acetylacetonate (Aldrich)
NaCl (Aldrich)
Silicone Fluid SF96/50 (Thomas Scientific, for making up the oil bath)
Isopropanol ('IPA' Pharmco)

The following solutions were prepared using said chemicals:
100 mM NaCl in EG (the 'NaCl Solution')
2.2 mM $Fe^{2+}(AcAc)_2$ in EG (the 'Fe(II) Solution')

Procedure:

To a 1000 mL round bottom flask, was added the 40 g PVP powder and 600 mL EG. The mixture was then heated to 130° C. (with the probe inserted in oil bath) in silicone oil bath with vigorous stirring until all the PVP powder had been dissolved and the temperature had stabilized for 30 minutes. 6 mL of the NaCl Solution (967 µM final concentration) and 20 mL Fe(II) Solution (=71 µM final amount) was then added. After 5 minutes, the 20 gram $AgNO_3$ powder was poured (in less than about 5 seconds) directly to the mixture while the mixture was stirred vigorously. After addition, the reaction mixture was heated to 130° C. under vigorous stirring for approximately 0.5 hour to 1.5 hours, at which time nanowires with weighted average length of 20 µm (micrometers) or longer were formed.

The oil bath was removed and the reaction permitted to cool to room temperature. The reaction mixture was poured into 2500 mL of isopropyl alcohol and the solids were permitted to settle. The settled product was then separated by decanting the supernatant, and resuspended in 2000 mL of isopropyl alcohol or DI water with stirring to wash off excess attached PVP from the silver nanowires before another settling process (when no stirring was used). This wash-settle process was repeated four times and then the silver nanowires were resuspended in the desired volume of isopropanol.

Figure 8:
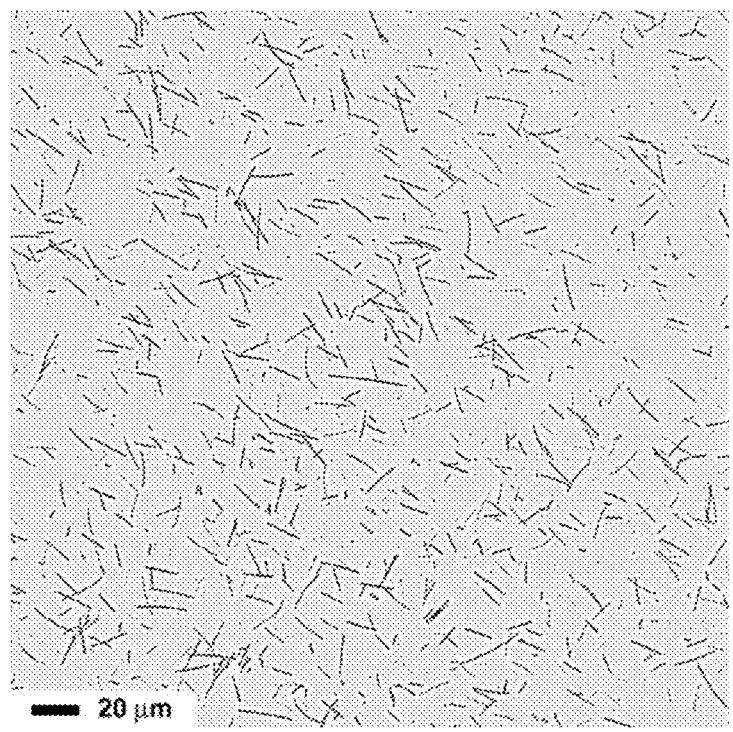
FIG. 8 is a microscope image of a representative nanowire preparation.

FIG. 8 is the microscope image of silver nanowire product produced by a reaction performed according to this protocol.

Example 6

This example uses the solution phase approach for the production of silver nanowires. A silver nanowire yield of greater than 60 weight percent** of all of the nanostructures produced is typically observed for this type of example.

The reaction temperature was approximately 130° C. The following chemicals were used in this reaction:
Anhydrous Ethylene Glycol ('EG')
Silver Nitrate ('$AgNO_3$', Aldrich)
Poly (vinyl pyrrolidone) ('PVP', 55,000 MW)
Iron (II) Acetylacetonate (Aldrich)
NaCl (Aldrich)
Nitric Acid Concentrated (Aldrich, 70% weight percentage)
Silicone Fluid SF96/50 (Thomas Scientific, for making up the oil bath)
Isopropanol (Pharmco)

The following solutions were prepared using said chemicals:
100 mM NaCl in EG (the 'NaCl Solution')
2.2 mM $Fe^{2+}(AcAc)_2$ in EG (the 'Fe(II) Solution')
100 g $AgNO_3$ in 500 mL EG (the '$AgNO_3$ Solution'—made up to be homogeneous at least 30 min before adding to the reaction)

Procedure:

To a 4000 mL beaker, was added the 240 g PVP powder and 2500 mL EG. The mixture was then heated to 130° C. (with the probe inserted in reaction mixture) in silicone oil bath with vigorous stirring (375 rpm) until all the PVP powder had been dissolved and the temperature had stabilized for 10 minutes. 15 mL of the NaCl Solution (483 µM final concentration) and 100 mL Fe(II) Solution (=71 µM final amount) was then added. After 5 minutes, 4.5 mL concentrated $HNO_3$ acid was added and the reaction mixture was heated for additional 3 minutes before the $AgNO_3$ Solution was poured (over a period of about 10 to about 20 seconds) into the mixture while the mixture was stirred at 375 rpm.

After silver nitrate solution addition, the reaction mixture was heated to 130° C. under vigorous stirring (375 rpm). When the reaction started producing nanowires, the stir rate was gradually lowered to 200 rpm within 3-5 minutes. For approximately 25 min to 1 hour, nanowires with average length of 30 µm or longer were formed. The reaction (heating) was then moved from the oil bath to an ice bath with continued stirring. When temperature dropped below 100 degrees, the reaction mixture was poured into a 15-liter bucket containing 8 liters of cold IPA, and permitted to settle. The settled product was separated by decanting the supernatant and resuspended in 8 L DI water with stirring to wash the excess attached PVP from the silver nanowires before another settling process (when no stirring was used) was performed. This wash-settle process was repeated four times and then the silver nanowires were resuspended in the desired volume of isopropanol.

Figure 9:
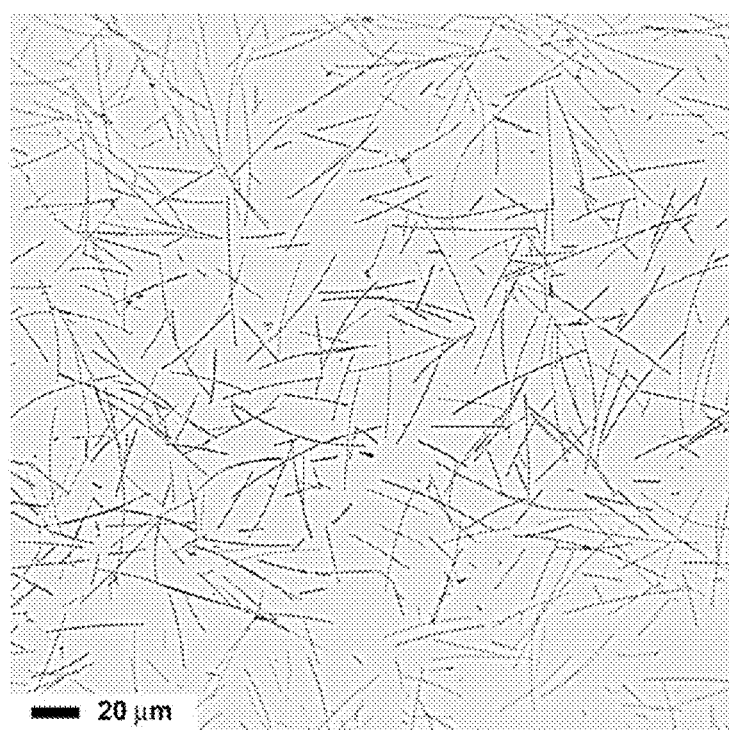
FIG. 9 is a microscope image of a representative nanowire preparation.

FIG. 9 is the microscope image of silver nanowire product produced by a reaction performed according to this protocol.

Example 7

This example uses the solution phase approach for the production of silver nanowires. A silver nanowire yield of greater than 60 weight percent** of all of the nanostructures produced is typically observed for this type of example.

The reaction temperature was approximately 120° C. The following chemicals were used in this reaction:
Anhydrous Ethylene Glycol ('EG')
Silver Nitrate ('AgNO$_3$', Aldrich)
Poly (vinyl pyrrolidone) ('PVP', Aldrich, 55,000 MW)
Iron (II) Acetylacetonate (Aldrich)
NaCl (Aldrich)
Nitric Acid Concentrated (Aldrich, 70% weight percentage)
Silicone Fluid SF96/50 (Thomas Scientific, for making up the oil bath)
Isopropanol (Pharmco)

The following solutions were prepared using said chemicals:
100 mM NaCl in EG (the 'NaCl Solution')
2.2 mM Fe$^{2+}$(AcAc)$_2$ in EG (the 'Fe(II) Solution')
28 g AgNO$_3$ in 50 mL EG (the 'AgNO$_3$ Solution'—made up to be homogeneous at least 30 min before adding to the reaction)

Procedure:
To a 1000 mL round bottom flask, was added the 28 g PVP powder and 250 mL EG. The mixture was then heated to 120° C. (with the probe inserted in the oil bath) in silicone oil bath with vigorous stirring until all the PVP powder had been dissolved and the temperature had stabilized for 10 minutes. 1.5 mL of the NaCl Solution (483 μM final concentration) and 10 mL Fe(II) Solution (=71 μM final amount) was then added. After 5 minutes the AgNO$_3$ solution was poured (in less than about 5 seconds) directly into the mixture while the mixture was vigorously stirred.

After addition, the reaction mixture was heated to 130° C. under vigorous stirring, when the reaction mixture had a turbid yellow green appearance, 1.1 mL concentrated HNO$_3$ acid was added. The reaction mixture then had a clear light yellow appearance. The reaction continued for approximately 1 hour to 2 hours, until nanowires with average length of 10 μm or longer were formed.

The oil bath was removed and the reaction permitted to cool to room temperature. The reaction mixture was poured into 1000 mL of isopropyl alcohol and the solids were permitted to settle. The settled product was then separated by decanting the supernatant, and then resuspended in 1000 mL of isopropyl alcohol or DI water with stirring to wash off the excess attached PVP from the silver nanowires before another settling process (when no stirring was used). This wash-settle process was repeated four times and then the silver nanowires were resuspended in the desired volume of isopropanol.

Figure 10A:
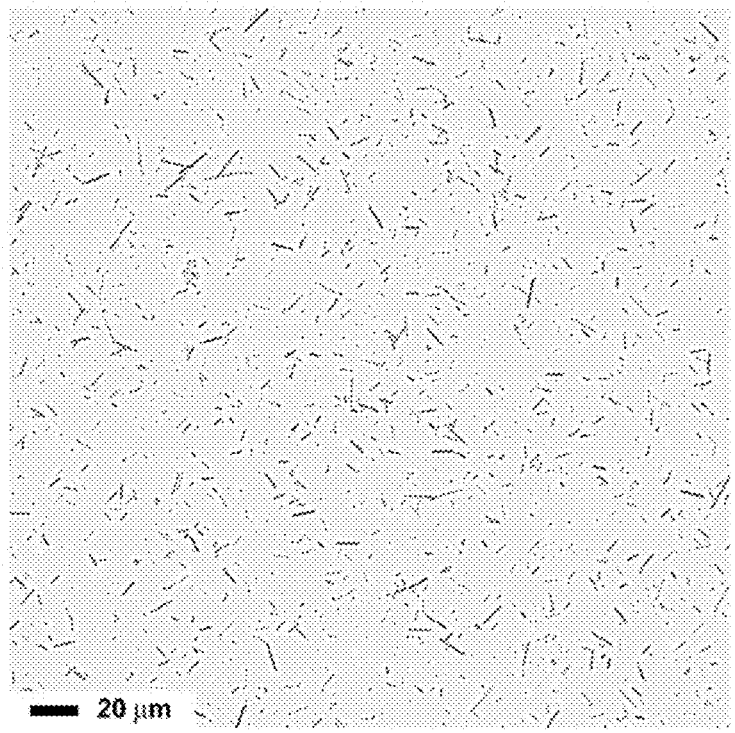
FIG. 10A is a microscope image of a representative nanowire preparation.
Figure 10B:
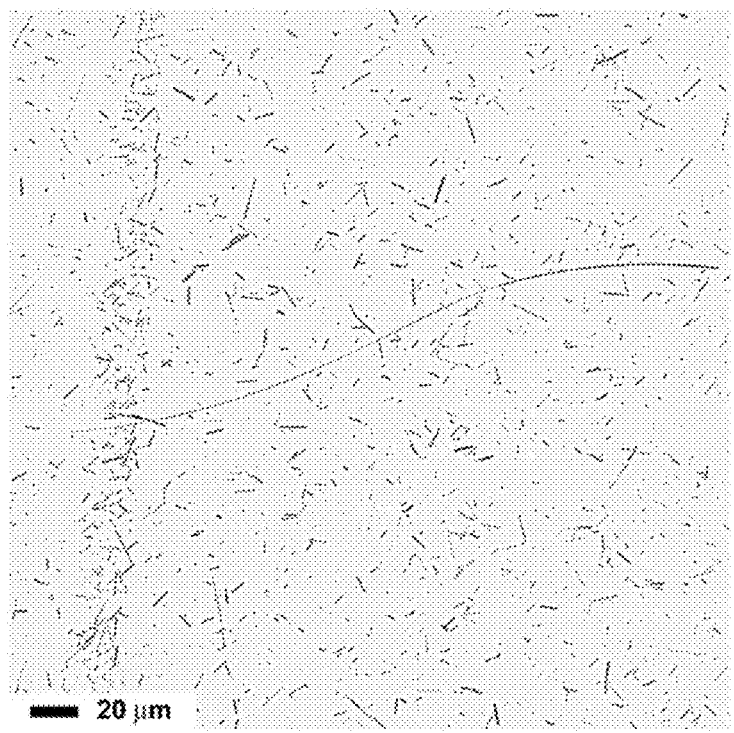
FIG. 10B is a microscope image of a representative nanowire preparation.

FIGS. 10A and 10B are microscope images of silver nanowire product produced by a reaction performed according to this protocol.

Example 8

This example uses the solution phase approach for the production of silver nanowires. A silver nanowire yield of greater than 60 weight percent** of all of the nanostructures produced is typically observed for this type of example.

The reaction temperature was approximately 130° C. The following chemicals were used in this reaction:
Anhydrous Ethylene Glycol ('EG')
Silver Nitrate ('AgNO$_3$', Aldrich)
Poly (vinyl pyrrolidone) ('PVP', Aldrich, 55,000 MW)
Iron (II) Acetylacetonate (Aldrich)
NaCl (Aldrich)
Concentrated HNO$_3$ Acid (Aldrich, 70% weight percentage)
Silicone Fluid SF96/50 (Thomas Scientific, for making up the oil bath)
Isopropanol (Pharmco)

The following solutions were prepared using said chemicals:
100 mM NaCl in EG (the 'NaCl Solution')
2.2 mM Fe$^{2+}$(AcAc)$_2$ in EG (the 'Fe(II) Solution')

Procedure:
To a 4000 mL beaker, was added the 240 g PVP powder and 3000 mL EG. The mixture was then heated to 130° C. (with the probe inserted in the reaction mixture) in silicone oil bath with vigorous stirring (375 rpm) until all of the PVP powder dissolved and the temperature had stabilized for 10 minutes. 15 mL of the NaCl Solution (483 μM final concentration) and 100 mL Fe(II) Solution (=71 μM final amount) was then added. After 5 minutes, 4.5 mL concentrated HNO$_3$ acid was added and the reaction mixture was heated for an additional 3 minutes before 100 gram AgNO$_3$ powder was added (in less than about 5 seconds) directly to the mixture while the mixture was stirred at 375 rpm.

After AgNO$_3$ addition, the reaction mixture was heated to 130° C. under vigorous stirring (375 rpm). When the reaction started producing nanowires, the stir rate was gradually lowered to 200 rpm within 3-5 minutes. For approximately 25 min to 1 hour, nanowires with average length of 30 μm or longer were formed. The reaction was then moved from the oil bath to an ice bath with continued stirring. When the temperature dropped below 100 degrees, the reaction mixture was poured into a 15-liter bucket containing 8 liters of ice-cold IPA, and permitted to settle. The product was then separated by decanting the supernatant, and resuspended in 8 L DI water with stirring to wash away excess attached PVP from the silver nanowires before another settling process (when no stirring was used) was performed. This wash-settle process was repeated four times and then the silver nanowires were resuspended in the desired volume of isopropanol.

Figure 11:
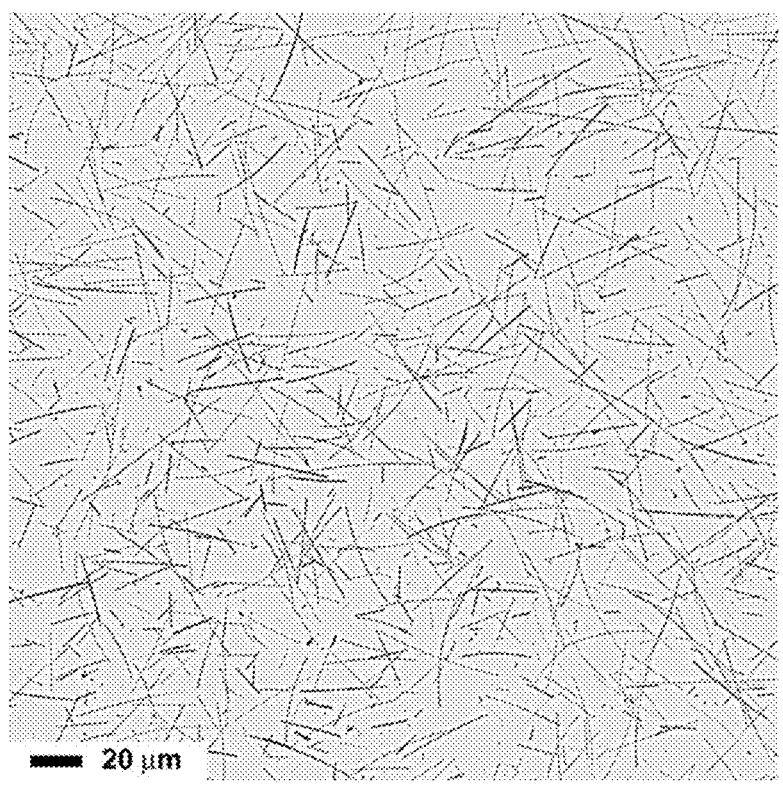
FIG. 11 is a microscope image of a representative nanowire preparation.

FIG. 11 is the microscope image of silver nanowire product produced by a reaction performed according to this protocol.

Example 9

This example uses the solution phase approach for the production of silver nanowires. A silver nanowire yield of greater than 50 weight percent** of all of the nanostructures produced is typically observed for this type of example.

The reaction temperature was approximately 130° C. The following chemicals were used in this reaction:
Anhydrous Ethylene Glycol ('EG')
Silver Nitrate ('AgNO$_3$', Aldrich)
Poly (vinyl pyrrolidone) ('PVP', Aldrich, 55,000 MW)
Iron (II) Acetylacetonate (Aldrich)
NaCl (Aldrich)
Nitric Acid Concentrated (Aldrich, 70% weight percentage)

Silicone Fluid SF96/50 (Thomas Scientific, for making up the oil bath)

Isopropanol (Pharmco)

The following solutions were prepared using said chemicals:

100 mM NaCl in EG (the 'NaCl Solution')

2.2 mM $Fe^{2+}(AcAc)_2$ in EG (the 'Fe(II) Solution')

Procedure:

To a 1000 mL round bottom flask, was added the 25 g PVP powder and 300 mL EG. The mixture was then heated to 130° C. (with the probe inserted in the oil bath) in silicone oil bath with vigorous stirring until all the PVP powder had been dissolved and the temperature had stabilized for 10 minutes. 1.5 mL of the NaCl Solution (483 µM final concentration) and 10 mL Fe(II) Solution (=71 µM final amount) was then added. After 5 minutes, 1.25 mL concentrated $HNO_3$ acid was added and heated for additional 3-5 min before 28 gram $AgNO_3$ powder was poured (in less than about 5 seconds) directly into the mixture while the mixture was vigorously stirred.

After addition, the reaction mixture was heated to 130° C. under vigorous stirring for approximately 1 hour to 2 hours, until nanowires with average length of 300 µm or longer were formed.

The oil bath was removed and the reaction permitted to cool to room temperature. The reaction mixture was poured into 1000 mL of isopropyl alcohol and the solids were permitted to settle. The settled product was then separated by decanting the supernatant, and then resuspended in 1000 mL of isopropyl alcohol or DI water with stirring to wash off the excess attached PVP from the silver nanowires before another settling process (when no stirring was used). This wash-settle process was repeated four times and then the silver nanowires were resuspended in the desired volume of isopropanol.

Figure 12:
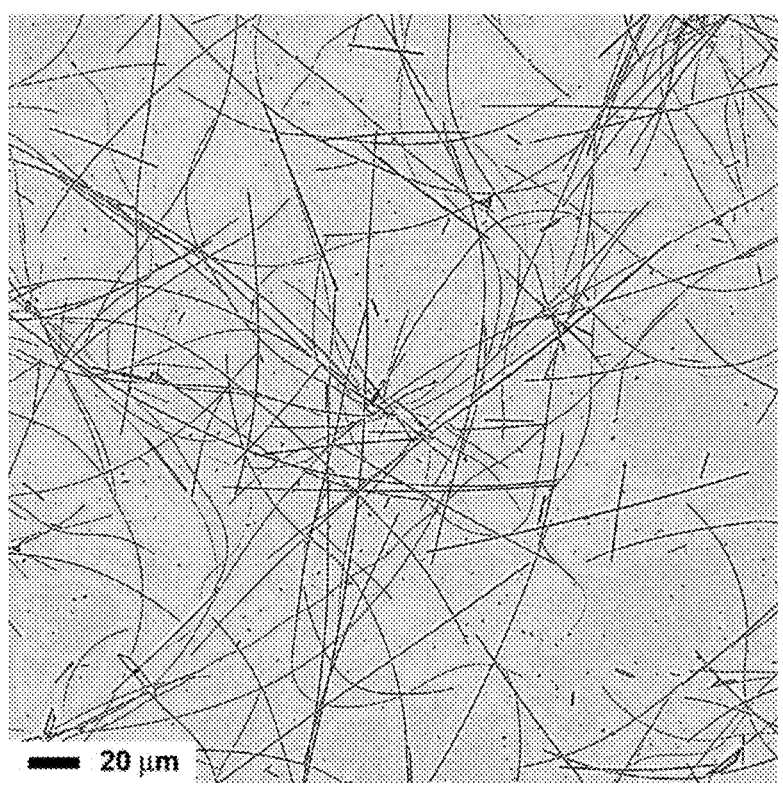
FIG. 12 is a microscope image of a representative nanowire preparation wherein the silver nanowires have very high aspect ratios, some in excess of 3000.

FIG. 12 is a microscope image of silver nanowire products produced by a reaction performed according to this protocol.

It is to be understood that although each of the forgoing examples employed a self-seeding approach, this is not a limitation. A seeded or seedless (self-seeding) approach can be used in the practice of embodiments of this invention. Moreover, embodiments of this invention can be practiced using heterogeneous or homogeneous seeding methods.

7. References

US Patent and Published Patent Applications

1. U.S. Pat. No. 4,539,041 to Figlarz et al. issued Sep. 3, 1985
2. U.S. Pat. No. 5,922,409 to McMordie et al. issued Jul. 13, 1999
3. US Published Patent Application No. US 2005/0056118 A1 to Xia et al. published on Mar. 17, 2005
4. US Published Patent Application No. US 2005/0090081 to Mascolo et al. published on Apr. 28, 2005
5. US Published Patent Application No. US 2006/0115536 A1 to Yacaman et al. published on Jun. 1, 2006
6. US Published Patent Application No. US 2007/0034052 A1 to Vanheusden et al. published on Feb. 15, 2007
7. US Published Patent Application No. US 2007/0074316 A1 to Alden et al. published on Mar. 29, 2007
8. US Published Patent Application No. US 2007/0158611 A1 to Oldenburg published on Jul. 12, 2007
9. US Published Patent Application No. US 2008/0003130 A1 to Xia et al. published on Jan. 3, 2008

Other Patent Documents

1. U.S. Provisional Application No. 60/815,627, filed on Jun. 21, 2006

Scientific Publications

1. Fievet et al., *Homogeneous and Heterogeneous Nucleations In The Polyol Process For The Preparation of Micron And Submicron Size Metal Particles*, Solid State Ionics, 32-33: 198-205 (1989)
2. Ducamp-Sanguesa et al., *Synthesis and Characterization of Fine and Monodisperse Silver Particles of Uniform Shape*, Journal of Solid State Chemistry, 100: 272-280 (1992)
3. Silvert et al., *Preparation of colloidal silver dispersions by the polyol process, Part 1—Synthesis and characterization*, J. Mater. Chem., 6(4): 573-577 (1996)
4. Silvert et al., *Preparation of colloidal silver dispersions by the polyol process, Part 2—Mechanism of particle formation*, J. Mater. Chem. 7(2): 293-299 (1997)
5. Carotenuto et al., *Preparation and characterization of nano-sized Ag/PVP composites for optical applications*, Eur. Phys. J. B., 16: 11-17 (2000)
6. Sun et al., *Crystalline Silver Nanowires by Soft Solution Processing*, Nano Letters, 2(2): 165-168 (2002)
7. Sun et al., *Large-Scale Synthesis of Uniform Silver Nanowires Through a Soft, Self-Seeding, Polyol Process*, Adv. Mater. 14(11): 833-837 (2002)
8. Sun et al., *Uniform Silver Nanowires Synthesis by Reducing $AgNO_3$ with Ethylene Glycol in the Presence of Seeds and Poly(Vinyl Pyrrolidone)*, Chem, Mater. 14: 4736-4745 (2002)
9. Sun et al., *Shape-Controlled Synthesis of Gold and Silver Nanoparticles*, Science, 298: 2176-2179 (2002)
10. Sun et al., *Polyol Synthesis of Uniform Silver Nanowires: A Plausible Growth Mechanism and the Supporting Evidence*, Nano Letters, 3(7): 955-960 (2003)
11. Wiley et al., *Polyol Synthesis of Silver Nanoparticles: Use of Chloride and Oxygen to Promote the Formation of Single-Crystal, Truncated Cubes and Tetrahedrons*, Nano Letters, 4(9): 1733-1739 (2004)
12. Wiley et al., *Polyol Synthesis of Silver Nanostructures: Control of Product Morphology with Fe(II) or Fe(III) Species*, Langmuir, 21(18): 8077-8080 (2005)
13. Wiley et al., *Shape-Controlled Synthesis of Metal Nanostructures: The Case of Silver*, Chem. Eur. J., 11: 454-463 (2005)
14. Wiley et al., *Maneuvering the Surface Plasmon Resonance of Silver Nanostructures through Shape-Controlled Synthesis*, J. Phys. Chem. B., 110: 15666-15675 (2006)
15. Reyes-Gasga et al., *On the structure of nanorods and nanowires with pentagonal cross-sections*, Journal of Crystal Growth, 286: 162-172 (2006)
16. Wiley et al., *Synthesis of Silver Nanostructures with Controlled Shapes and Properties*, Acc. Chem. Res., 40: 1067-1076 (2007)
17. Chen et al., *One-Dimensional Nanostructure of Metals: Large-Scale Synthesis and Some Potential Applications*, Langmuir, 23: 4120-1429 (2007)

While the present teachings are described in conjunction with various embodiments, it is not intended that the present teachings be limited to such embodiments. On the contrary, the present teachings encompass various alternatives, modifications and equivalents, as will be appreciated by those of skill in the art. Thus, the invention as contemplated by applicants extends to all functionally equivalent structures, methods and uses, such as are within the scope of the appended claims.

Moreover, in the following claims it should be understood that the order of steps or order for performing certain actions (e.g. mixing of reactants) is immaterial so long as the present teachings remain operable. Unless expressly stated otherwise or where performing the steps of a claim in a certain order would be non-operative, the steps and/or substeps of the following claims can be executed in any order. Moreover, two or more steps or actions can be conducted simultaneously.

We claim:

1. A method for the production of silver nanowires comprising reacting:
   i) at least one polyol;
   ii) at least one silver solution comprising at least one silver compound capable of producing silver metal when reduced; and
   iii) at least one organic protective agent (OPA);
   as reactants in a reaction at a reaction temperature and under conditions that produce silver nanowires wherein the molar concentration of the silver compound in the silver solution is in the range of about 0.3 molar to about 3.0 molar, wherein the nanowires have an aspect ratio (length/diameter) of at least 150.

2. The method of claim 1, wherein the nanowires have an aspect ratio (length/diameter) of at least 250.

3. The method of claim 1, wherein the nanowires have an aspect ratio (length/diameter) of at least 1000.

4. The method of claim 1, wherein the nanowires have an aspect ratio (length/diameter) of at least 1500.

5. The method of claim 1, wherein the nanowires have an aspect ratio (length/diameter) of at least 2000.

6. The method of claim 1, wherein the nanowires have an aspect ratio (length/diameter) of at least 3000.

7. The method of claim 1, wherein the reaction produces bulk silver nanowire product having a length weighted average of at least 15 µm.

8. The method of claim 1, wherein the reaction produces bulk silver nanowire product having a length weighted average of at least 20 µm.

9. The method of claim 1, wherein the reaction produces bulk silver nanowire product having a length weighted average of 25 µm to 30 µm.

10. A method for the production of silver nanowires, said method comprising:
    reacting:
    i) at least one polyol;
    ii) at least one silver solution comprising at least one silver compound capable of producing silver metal when reduced; and
    iii) at least one organic protective agent (OPA);
    as reactants in a reaction at a reaction temperature and under conditions that produce silver nanowires wherein the molar concentration of the silver compound in the silver solution is in the range of about 0.3 molar to about 3.0 molar, wherein the reaction produces bulk silver nanowire product having an aspect ratio weighted average that is at least 125.

11. A method for the production of silver nanowires comprising:
    i) mixing as reactants for a reaction: a) at least one silver solution comprising at least one silver compound capable of producing silver metal when reduced; b) at least one polyol; and c) at least one organic protective agent to produce a mixture; and
    ii) reacting said mixture at a reaction temperature and under conditions that produce a product solution comprising silver nanowires;
    wherein the molar concentration of the silver compound in the silver solution is in the range of about 0.3 molar to about 3.0 molar, wherein the nanowires have an aspect ratio (length/diameter) of at least 150.

12. The method of claim 11, wherein the nanowires have an aspect ratio (length/diameter) of at least 250.

13. The method of claim 11, wherein the nanowires have an aspect ratio (length/diameter) of at least 1000.

14. The method of claim 11, wherein the nanowires have an aspect ratio (length/diameter) of at least 1500.

15. The method of claim 11, wherein the nanowires have an aspect ratio (length/diameter) of at least 2000.

16. The method of claim 11, wherein the nanowires have an aspect ratio (length/diameter) of at least 3000.

17. The method of claim 11, wherein the reaction produces bulk silver nanowire product having a length weighted average of at least 15 µm.

18. The method of claim 11, wherein the reaction produces bulk silver nanowire product having a length weighted average of at least 20 µm.

19. The method of claim 11, wherein the reaction produces bulk silver nanowire product having a length weighted average of 25 µm to 30 µm.

20. A method for the production of silver nanowires, said method comprising:
    i) mixing as reactants for a reaction: a) at least one silver solution comprising at least one silver compound capable of producing silver metal when reduced; b) at least one polyol; and c) at least one organic protective agent to produce a mixture; and
    ii) reacting said mixture at a reaction temperature and under conditions that produce a product solution comprising silver nanowires;
    wherein the molar concentration of the silver compound in the silver solution is in the range of about 0.3 molar to about 3.0 molar, wherein the reaction produces bulk silver nanowire product having an aspect ratio weighted average that is at least 125.

* * * * *